US 11,417,628 B2

(12) United States Patent
Chen et al.

(10) Patent No.: US 11,417,628 B2
(45) Date of Patent: Aug. 16, 2022

(54) METHOD FOR MANUFACTURING SEMICONDUCTOR STRUCTURE

(71) Applicant: AP MEMORY TECHNOLOGY CORPORATION, Hsinchu County (TW)

(72) Inventors: Wenliang Chen, Hsinchu County (TW); Jun Gu, Hsinchu County (TW); Masaru Haraguchi, Tokyo (JP); Takashi Kubo, Tokyo (JP); Chien An Yu, Hsinchu County (TW); Chun Yi Lin, Hsinchu County (TW)

(73) Assignee: AP Memory Technology Corporation, Hsinchu County (TW)

( * ) Notice: Subject to any disclaimer, the term of this patent is extended or adjusted under 35 U.S.C. 154(b) by 2 days.

(21) Appl. No.: 17/009,353

(22) Filed: Sep. 1, 2020

(65) Prior Publication Data

US 2020/0402951 A1    Dec. 24, 2020
US 2021/0398943 A9    Dec. 23, 2021

Related U.S. Application Data

(63) Continuation-in-part of application No. 16/232,417, filed on Dec. 26, 2018, now Pat. No. 10,811,402.
(Continued)

(51) Int. Cl.
*H01L 21/768*  (2006.01)
*H01L 23/00*  (2006.01)
(Continued)

(52) U.S. Cl.
CPC .......... *H01L 24/83* (2013.01); *H01L 21/4814* (2013.01); *H01L 21/78* (2013.01);
(Continued)

(58) Field of Classification Search
CPC ..... H01L 21/48; H01L 21/78; H01L 21/4814; H01L 23/00; H01L 24/03; H01L 24/05;
(Continued)

(56) References Cited

U.S. PATENT DOCUMENTS 5,939,782 A    8/1999  Malladi
7,602,002 B2  10/2009  Inoue et al.
(Continued)

FOREIGN PATENT DOCUMENTS

| TW | I694597 | 8/2020 |
|---|---|---|
| WO | 20181983301 A1 | 11/2018 |
| WO | 2020005333 A1 | 1/2020 |

OTHER PUBLICATIONS

F. Roozeboom et. al., "Ultrahigh-density (> 0.4 µF/mm2) trench capacitors in silicon," Workshop on Power Supply On Chip (PowerSoC08), Cork, Ireland, Sep. 22-24, 2008.
(Continued)

*Primary Examiner* — Chuong A Luu
(74) *Attorney, Agent, or Firm* — WPAT, P.C., Intellectual Property Attorneys; Anthony King

(57) ABSTRACT

A method for manufacturing a semiconductor structures is provided. The method includes forming a first hybrid bonding layer over a first wafer having a logic structure, forming a second hybrid bonding layer over a second wafer having a first capacitor structure, bonding the first wafer and the second wafer through a hybrid bonding operation to connect the first hybrid bonding layer and the second hybrid bonding layer, thereby obtaining a first bonded wafer, and the first capacitor structure is electrically connected to the logic structure through the first hybrid bonding layer and the second hybrid bonding layer, and singulating the first bonded wafer to obtain a plurality of semiconductor structures.

25 Claims, 28 Drawing Sheets

Related U.S. Application Data

(60) Provisional application No. 62/895,467, filed on Sep. 3, 2019.

(51) Int. Cl.
  H01L 21/78 (2006.01)
  H01L 21/48 (2006.01)
  H01L 27/108 (2006.01)

(52) U.S. Cl.
  CPC .............. *H01L 24/03* (2013.01); *H01L 24/11* (2013.01); *H01L 24/27* (2013.01); *H01L 27/10858* (2013.01); *H01L 2924/1205* (2013.01); *H01L 2924/1431* (2013.01)

(58) Field of Classification Search
  CPC ......... H01L 24/11; H01L 24/27; H01L 24/29; H01L 24/83; H01L 24/32; H01L 24/94; H01L 24/80; H01L 27/108; H01L 27/10858; H01L 25/00; H01L 25/16; H01L 25/50; H01L 24/08; H01L 2224/08145; H01L 2224/83896; H01L 2224/80895; H01L 2224/32145; H01L 2224/29186; H01L 2224/73251; H01L 2224/13099; H01L 2224/05647; H01L 2924/1205; H01L 2924/1431; H01L 21/768; H01L 21/76831; H01L 21/76898; H01L 21/8238; H01L 21/823871
  USPC .................................................. 438/455, 458
  See application file for complete search history.

(56) References Cited

U.S. PATENT DOCUMENTS

| | | |
|---|---|---|
| 8,845,854 B2 | 9/2014 | Lei et al. |
| 9,130,057 B1 | 9/2015 | Kumar et al. |
| 9,230,941 B2 | 1/2016 | Chen et al. |
| 9,269,646 B2 | 2/2016 | Luo et al. |
| 9,825,843 B2 | 11/2017 | Thottethodi et al. |
| 10,388,642 B2 | 8/2019 | Yaung et al. |
| 10,510,634 B2 | 12/2019 | Lin et al. |
| 10,600,781 B1 | 3/2020 | Xiao et al. |
| 2015/0318246 A1 | 11/2015 | Yu et al. |
| 2016/0012865 A1 | 1/2016 | Lee et al. |
| 2016/0358865 A1* | 12/2016 | Shih .................. H01L 25/0655 |
| 2017/0125436 A1 | 5/2017 | Sharangpani et al. |
| 2019/0044764 A1 | 2/2019 | Hollis et al. |
| 2019/0138412 A1 | 5/2019 | Ogasawara |
| 2019/0304935 A1 | 10/2019 | Collins et al. |
| 2020/0066668 A1 | 2/2020 | Umemoto |
| 2020/0075534 A1 | 3/2020 | Gao et al. |
| 2020/0098853 A1 | 3/2020 | Haraguchi et al. |
| 2020/0227366 A1 | 7/2020 | Dogiamis et al. |
| 2020/0243455 A1* | 7/2020 | Wang ..................... H01L 24/06 |
| 2020/0303361 A1 | 9/2020 | Shih |
| 2021/0134747 A1 | 5/2021 | Yang |
| 2021/0242189 A1 | 8/2021 | Or-Bach et al. |

OTHER PUBLICATIONS

Michael W. Baker, "Benefits of Stacked-Wafer Capacitors for High-Frequency Buck Converters", Power SoC, Northeastern University, Boston MA, United States, Oct. 7, 2014.

Murata, "3D Silicon Capacitors", CATSICAP1.5, Feb. 24, 2020. Available at https://www.murata.com/-/media/webrenewal/products/capacitor/siliconcapacitors/pdf/silicon-capacitors-cataloguev15murata.pdf.

Office Action, Cited References and Search Report dated Oct. 29, 2021 issued by the Taiwan Intellectual Property Office for the TW family patent Application No. 110113790.

Brief English translation of the Office Action and Search Report dated Oct. 29, 2021 issued by the Taiwan Intellectual Property Office for the TW family patent Application No. 110113790.

Non-final Office Action and Cited References dated Aug. 17, 2021 issued by the USPTO for the U.S. Appl. No. 17/019,303.

Non-Final Office Action of U.S. Appl. No. 16/920,427, dated Feb. 14, 2022.

Non-Final Office Action and search report of TW family patent Application No. 110113790, dated Feb. 15, 2022.

English translation of the Non-final Office Action and search report of TW family patent Application No. 110113790, dated Feb. 15, 2022.

English abstract translation of TWI694597B.

Notice of Allowance and List of References of U.S. Appl. No. 17/010,517, dated May 11, 2022.

* cited by examiner

METHOD FOR MANUFACTURING SEMICONDUCTOR STRUCTURE

PRIORITY CLAIM AND CROSS-REFERENCE

This application is a continuation-in-part of U.S. application Ser. No. 16/232,417, filed Dec. 26, 2018, the entire contents of which is incorporated herein by reference.

This application claims the benefit of prior-filed U.S. provisional application No. 62/895,467, filed Sep. 3, 2019, and incorporates its entirety herein.

FIELD

The present disclosure relates to a semiconductor structure and method for manufacturing a plurality thereof, particularly, the disclosed semiconductor structure includes a capacitor die stacked with an active die through a hybrid bonding structure.

BACKGROUND

Decoupling capacitors, which may be referred to as a bypass capacitor, may serve as an energy reservoir to the circuits integrated thereto. Generally, the decoupling capacitors are placed as close as possible to an integrated circuit (IC) on a PCB layout to oppose any unexpected change in the input voltages from a power supply. That is, in the case of the input voltage drops, the decoupling capacitor may provide enough power to an to keep the voltage stable, while in the case of the input voltage increases, the decoupling capacitor may absorb the excess energy that trying to flow through to the IC, and thus keeps the voltage stable.

In some applications, decoupling capacitors are implemented in a form of integrated passive device (IPD). IPD technology is a system in package (SiP) solution where passive devices with high quality can be fabricated on a chip and then connect with a main die by wire bonding or solder mounting. While IPD capacitors are widely used due to the features that including high/dense capacitance value and low Effective Series Resistance (ESR) and Equivalent Series Inductance (ESL), the aforesaid fashion of electrical connection (i.e., wire bonding or solder mounting) limit the further decrease of ESR and ESL, as well as the further reduction of capacitor size.

In high performance computing, IC power consumption can be as high as 100 W/cm$^2$. The technology requires considerably large amount of decoupling capacitors with even more demanding ESR and ESL. Therefore, alternative approaches to integrate the capacitor die and the main die are required to achieve the purpose.

BRIEF DESCRIPTION OF THE DRAWINGS

Aspects of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
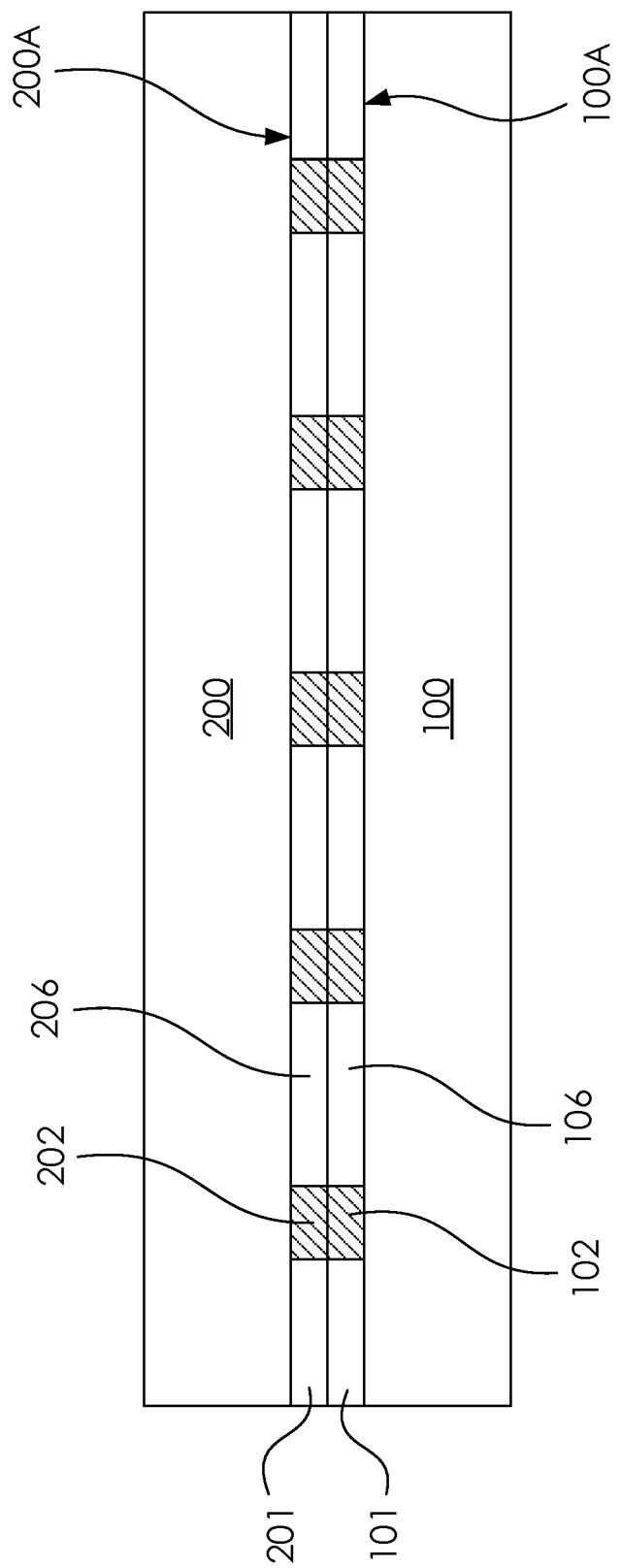
FIG. 1 illustrates a cross-sectional view of a semiconductor structure according to some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first", "second" and "third" describe various elements, components, regions, layers and/or sections, these elements, components, regions, layers and/or sections should not be limited by these terms. These terms may be only used to distinguish one element, component, region, layer or section from another. The terms such as "first", "second", and "third" when used herein do not imply a sequence or order unless clearly indicated by the context.

FIG. 1 illustrates a semiconductor structure which includes a capacitor die integrated with active die through wafer stacking. As shown in the figure, the semiconductor structure includes an active die 100 and a capacitor die 200. The active die 100 has a first hybrid bonding layer 101 on a surface 100A of the active die 100. The capacitor die 200 has a second hybrid bonding layer 201 on a surface of the 200A of the capacitor die 200. In some embodiments, the size of the active die 100 is identical to the size of the capacitor die 200.

As shown in FIG. 1, the first hybrid bonding layer 101 is in contact with the second hybrid bonding layer 201, and thus formed a hybrid bonding structure that sandwiched by the active die 100 and the capacitor die 200. The hybrid bonding structure is configured to integrate the active die 100 and the capacitor die 200, and therefore the active die 100 may be electrically coupled to the capacitor die 200 through the first hybrid bonding layer 101 and the second hybrid bonding layer 201. In some embodiments, each of the first hybrid bonding layer 101 and the second hybrid bonding layer 201 includes a plurality of bonding pads 101, 202 laterally surrounded by dielectric material, for example, oxide materials.

Figure 2:
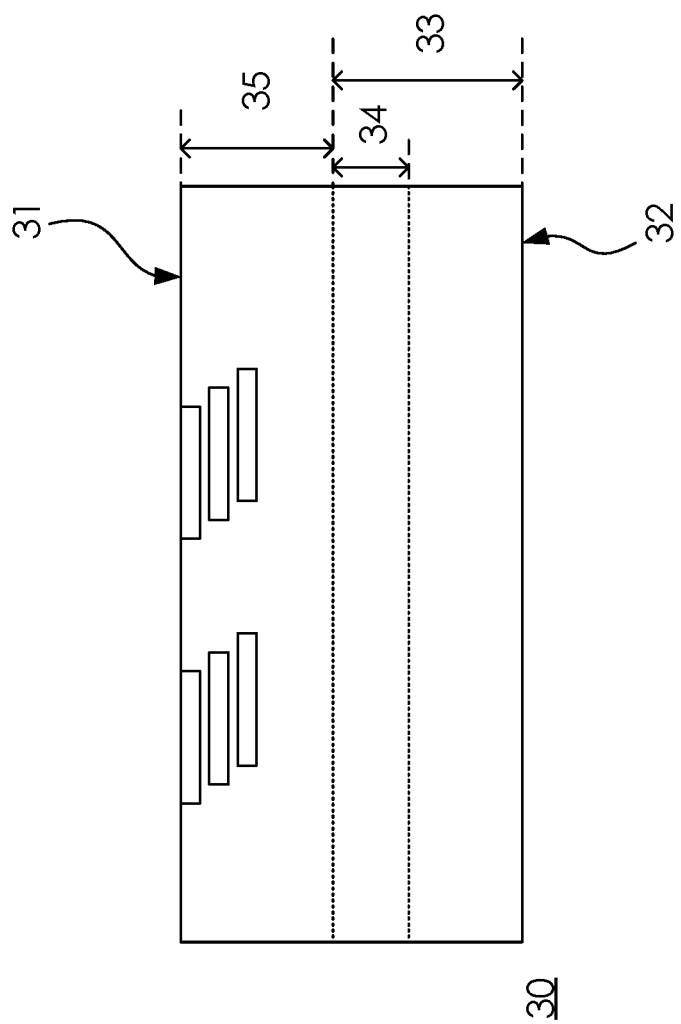
FIG. 2 illustrates a definition of a front side and a back side of a semiconductor structure or a semiconductor wafer.

Hybrid bonding is a method which may connect two substrates or wafers by metal bonding and by oxide bonding at the same time; that is, allowing face-to-face or face-to-back, or back-to-back connections of substrates or wafers. For the purpose of illustration, FIG. 2 shows a definition of a front side 31 and a back side 32 of a semiconductor structure 30 such as a semiconductor substrate or a semiconductor wafer. The semiconductor structure 30 (e.g. the active die 100 or the capacitor die 200 as shown in FIG. 1) may comprise a semiconductor substrate 33 and a back-end-of-line (BEM) structure 35, in which a front-end-of-line (FEOL) structure 34 is formed in/on the semiconductor structure 33. According to the embodiments, the surface of the BEOL, structure 35 may be the front side 31 of the semiconductor structure 30, and the surface of the semiconductor substrate 33 may be the back side 32 of the semiconductor structure 30. However, this is not a limitation of the present embodiments. The definition of the front side and the back side of a semiconductor structure may be switched.

Accordingly, in some embodiments, the positions of the active die 100 and the capacitor die 200 may be aligned vertically and therefore the plurality of first bonding pads 102 of the first hybrid bonding layer 101 may be in contact with the plurality of second bonding pads 202 of the second hybrid bonding layer 201, while a plurality of first oxide portions 106 of the first hybrid bonding layer 101 are in contact with a plurality of second oxide portions 206 of the second hybrid bonding layer 201. In such embodiments, the distribution of the first bonding pads 102 of first hybrid bonding layer 101 is a mirror image of the distribution of the second bonding pads 202 of second hybrid bonding layer 201.

In some embodiments, the first bonding pads 102 and the second bonding pads 202 are made by copper (Cu). In some embodiments, the first oxide portions 106 and the second oxide portions 206 are made by dielectric materials such as silicon oxide ($SiO_2$). In order to robust Cu—Cu connection, the control of the surface flatness of bonding pads is an important factor. For instance, in some embodiments, the surface of the Cu bonding pads may be controlled to be substantially coplanar to that of the $SiO_2$ portions by performing a chemical mechanical polishing (CMP) operation. Depending on the hybrid bonding operations, in some embodiments, the $SiO_2$ portions can be slightly protruding from the Cu bonding pads. In the present disclosure, for example, the active die 100 and the capacitor die 200 may be bonded by first drawing the first oxide portions 106 into contact with the second oxide portions 206, the aforesaid oxide portions may be bonded via Van der Waals force, subsequently, an annealing operation may be implemented to foster the connections of the first bonding pads 102 and the second bonding pads 202.

Figure 3:
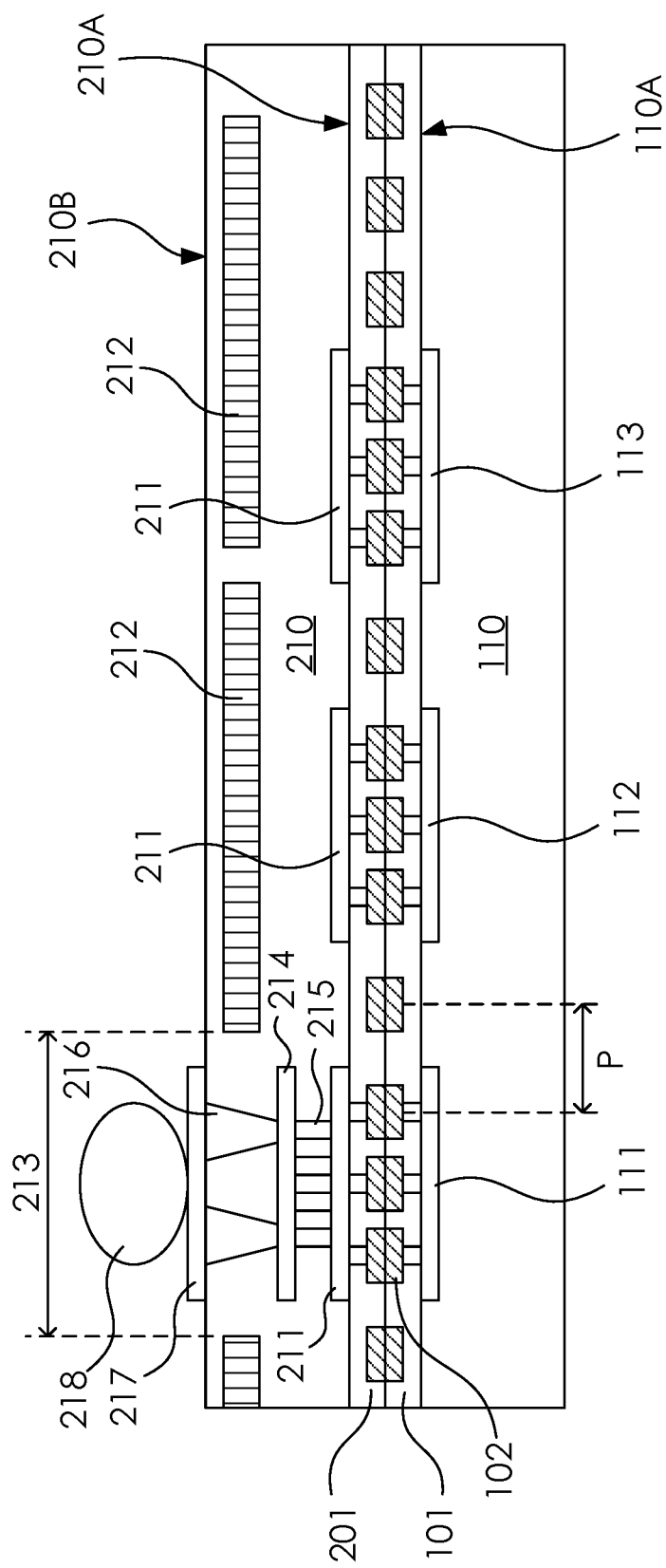
FIG. 3 illustrates a cross-sectional view of a semiconductor structure according to some embodiments of the present disclosure.

As shown in FIG. 3, in some embodiments, the semiconductor structure may include an active wafer 110 and an integrated Passive Device (LPD) wafer 210 stacked on the active wafer 110. The active wafer 110 and the IPD wafer 210 may be stacked through aforementioned hybrid bonding technique; accordingly, the hybrid bonding structure including first hybrid bonding layer 101 and the second hybrid bonding layer 201 is sandwiched by the active wafer 110 and the IPD wafer 210.

In some embodiments, the active wafer 110 includes a plurality of active top metals at a front side 110A of the active wafer 110, while these top metals may be at least functioned as an I/O pad 111, a VDD pad 112 and a VSS pad 113. Each of the I/O pad 111, the VDD pad 112 and the VSS pad 113 are electrically coupled to one of the first bonding pads 102 of the first hybrid bonding layer 101. In some embodiments, the IPD wafer 210 includes a plurality of capacitor structures 212 therein, and thus the IPD wafer 210 may be called as a capacitor wafer. The capacitor structures 212 may be electrically coupled to a plurality of capacitor top metals 211 at a front side 210A of the IPD wafer 210 through wiring, conductive via or RDL (not shown in the figure). In such embodiments, one of the capacitor top metals 211 is implemented as a power terminal of the capacitor structures 212, while another one of the capacitor top metals 211 is implemented as a ground terminal of the capacitor structures 212. Accordingly, by electrically coupling through the capacitor top metals 211, the first and the second hybrid bonding layers 101, 201, the capacitor structures 212 in the IPD wafer 210 may be electrically coupled to the power terminal (e.g., VDD pad 112) and the ground terminal (e.g., VSS pad 113) of the active wafer 110. In such embodiments, the capacitor structures 212 in the IPD wafer 210 may be electrically coupled to the circuit in the active wafer 110 without using traditional interconnecting methods such as wire bonding or Controlled Collapse Chip Connection (C4) bump that having solder bumps laterally surrounded by molding compounds therebetween.

Generally, decoupling capacitors are used to reduce power supply fluctuation. For instance, in high performance computing, IC power consumption may as high as about 100 W/cm$^2$, which requires a large amount of decoupling capacitors for lowering Effective Series Resistance (ESR) and Equivalent Series inductance (ESL). In other words, ideally, the capacitance should be infinity (i.e., as large as possible) while ESR and ESL should be zero (i.e., as small as possible). Due to such requirement, IPD capacitors is widely used based on the nature of a dense capacitance value with low ESL and ESR; however, how to position the IPD capacitors with the logic circuit to effectively enhance the performance of the IC is a critical issue that should be considered.

Accordingly, in the present disclosure, the active wafer 110 and the IPD wafer 210 are integrated by hybrid bonding technique to reduce the distance therebetween as much as possible. The large amount of connection terminals between the active wafer 110 and the IPD wafer 210 through hybrid bonding technique also reduces the ESR and ESL in the integrated circuit. For example, the IPD wafer 210 may include a plurality of capacitor dies that each of them may include a die size of 800 mm$^2$ and about 700 W power consumption. Such capacitor die may provide capacitance as much as about 800 μF and be connected to the active die (e.g., the die having the logic circuit) in the active wafer 110 through more than 1,000,000 connection terminals. The large number of connection terminals may significantly reduce ESR and ESL in the IC to practically zero. As shown in FIG. 3, in some embodiments, a bonding pitch P between the adjacent bonding pads 102 is less than about 3 μm, and therefore millions of connections may be used to connect the active die 100 and the capacitor die 200 as shown in FIG. 1 or the active wafer 110 and the IPD wafer 210 in FIG. 3.

Figure 4:
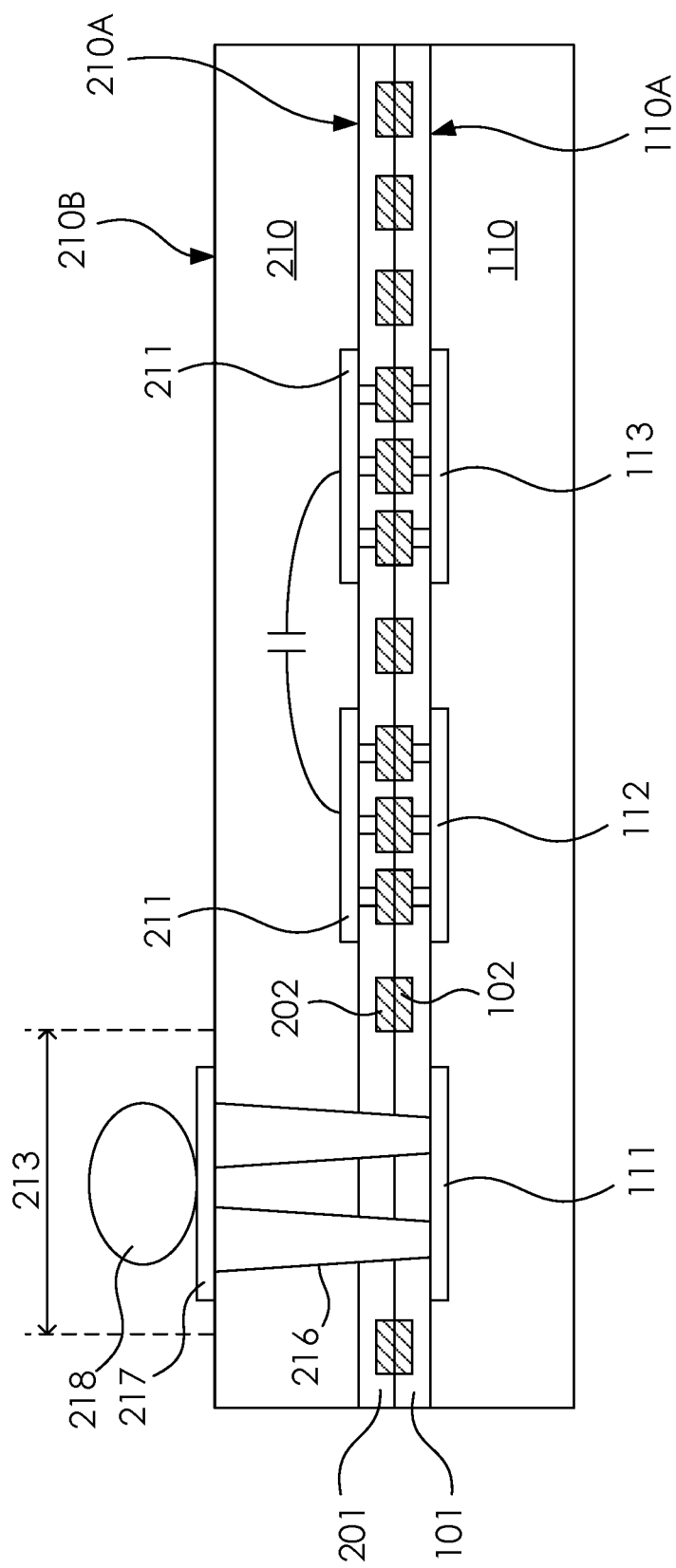
FIG. 4 illustrates a cross-sectional view of a semiconductor structure according to some embodiments of the present disclosure.

In some embodiments, the capacitor structures 212 in the IPD wafer 210 may be arranged to provide a keep-out zone 213 for forming a back-side through silicon via (BTSV) 216. The BTSV 216 referred herein include the via partially penetrating the IPD wafer 210 as shown in FIG. 3, and the via completely penetrating the IPD wafer 210, as shown in FIG. 4. For instance, IPD wafer 210 may include a metal layer 214 therein, which is electrically coupled to a top metal 211 in the IPD wafer 210 through a plurality of conductive vias 215. In an opposite direction, the metal layer 214 is electrically coupled a back side 210B of the IPD wafer 210 through BTSVs 216. The back side 210B of the IPD wafer 210 may include an electrode which includes a conductive pad 217 and a conductive bump 218 that receives the connection from BTSV 216. In some embodiments, the metal layer 214 is formed in an interlayer dielectric (ILD) of the IPD wafer 210.

As shown in FIG. 4, in some embodiments, the semiconductor structure may include BTSVs 216 that extends from the back side 210B of the IPD wafer 210 to directly in contact with the I/O pad 111 at the front side 110A of the active wafer 110. In such embodiments, the BTSVs 216 may be formed penetrating through the IPD wafer 210, the second hybrid bonding layer 201, and the first hybrid bonding layer 101, while the keep-out zone 213 is free from forming the first bonding pads 102 and the second bonding pads 202 from a top view perspective. The capacitor structures in the IPD wafer 210 are illustrated in electronic symbols for brevity.

Figure 5:
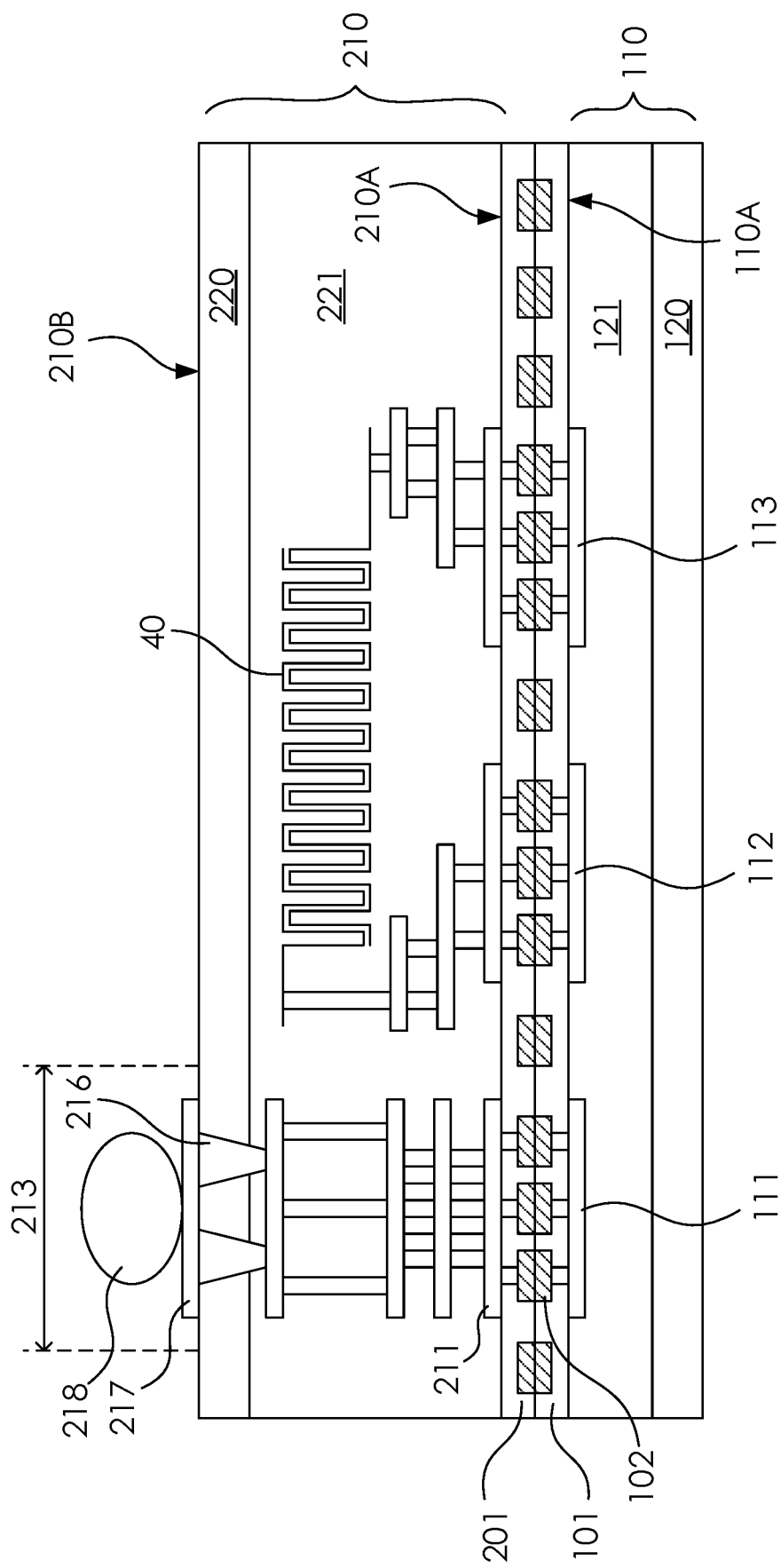
FIG. 5 illustrates a cross-sectional view of a semiconductor structure according to some embodiments of the present disclosure.

As shown in FIG. 5, in some embodiments, the semiconductor structure may include a metal-insulator-metal (MIM) stack capacitor 40 in the IPD wafer 210. In such embodiments, the active wafer 110 includes a first semiconductor substrate 120 and a first ILD 121 formed thereon. The top metals such as the I/O pad 111, the VDD pad 112 and the VSS pad 113 are formed at a front side of the first ILD 121. The IPD wafer 210 includes a second semiconductor substrate 220 and a second ILD 221 formed thereon. In some embodiments, the MIM stack capacitor 40 is formed in the second ILD 221 by DRAM process technology. Note the second ILD 221 is below the second semiconductor substrate 220 in FIG. 5 because the active wafer 110 and the IPD wafer 210 are stacked with a face-to-face arrangement, which will be described later.

In some embodiments, the first semiconductor substrate 120 and the second semiconductor substrate 220 may be made of semiconductor materials such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations thereof, and the like, may also be used.

In some embodiments, the MIM stack capacitor 40 in the IPD wafer 210 is formed in the second ILD 221 and electrically coupled to the VDD pad 112 and the VSS pad 113 of the active wafer 110 through the metals layers and the conductive vias in the second ILD 221 and the bonding pads 102, 202 in the hybrid bonding layers 101, 201. The terminals of the MIM stack capacitor 40 are in contact with the conductive vias in the second ILD 221. In such embodiments, the BTSVs 216 may extend from the back side 210B of the IPD wafer 210 to in contact with the metal layer in the second ILD 221 in the keep-out zone 213 for external signal connections at the back side 210B of the IPD wafer 210.

Figure 6:
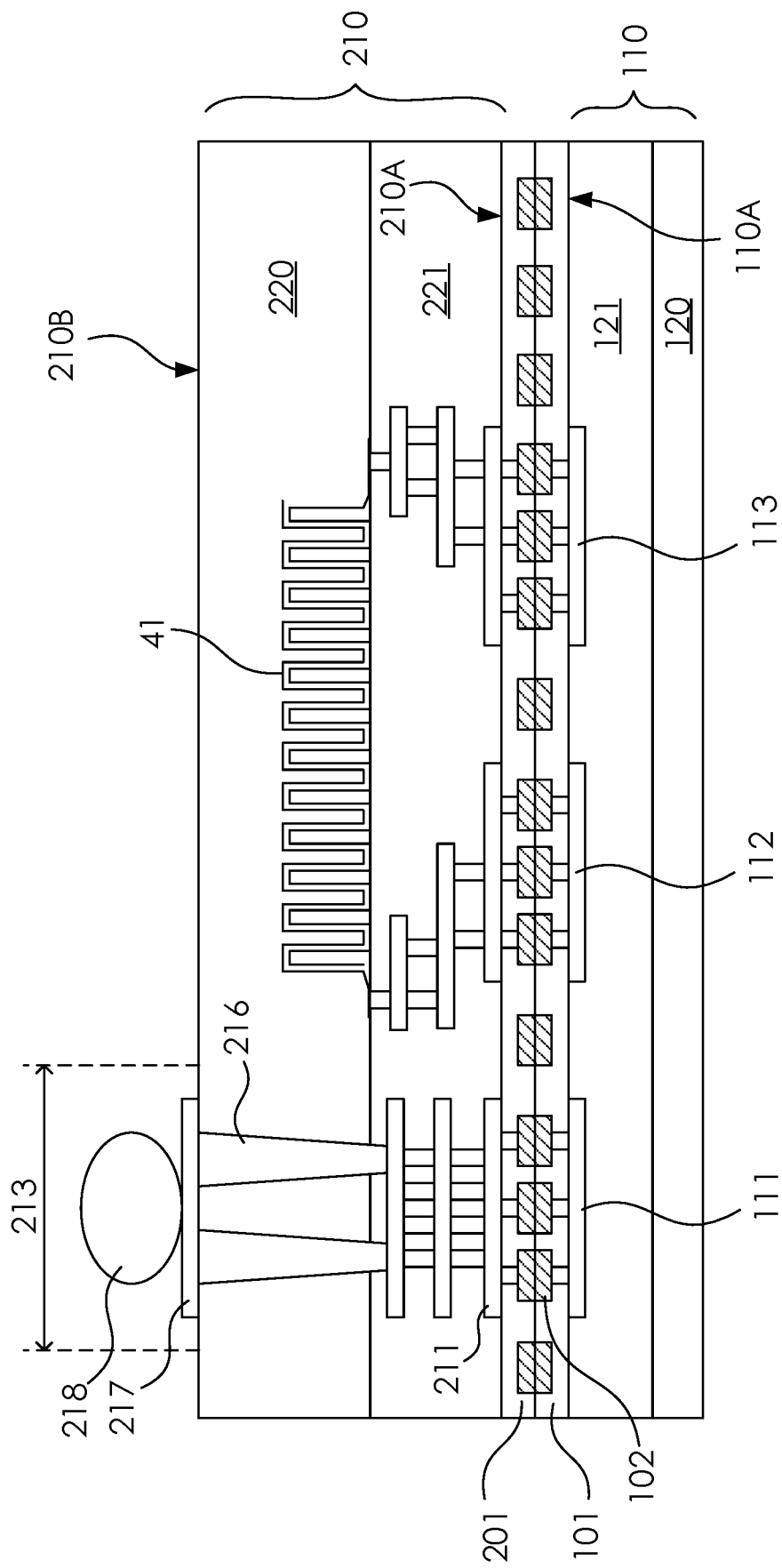
FIG. 6 illustrates a cross-sectional view of a semiconductor structure according to some embodiments of the present disclosure.

As shown in FIG. 6, in some embodiments, the semiconductor structure may include a deep trench MIM capacitor 41 in the second semiconductor substrate 220 of the IPD wafer 210. Instead of formed in the second ILD 221 as shown in FIG. 5, the deep trench MIM capacitor 41 is formed in the second semiconductor substrate 220 using suitable front end operations.

Figure 7:
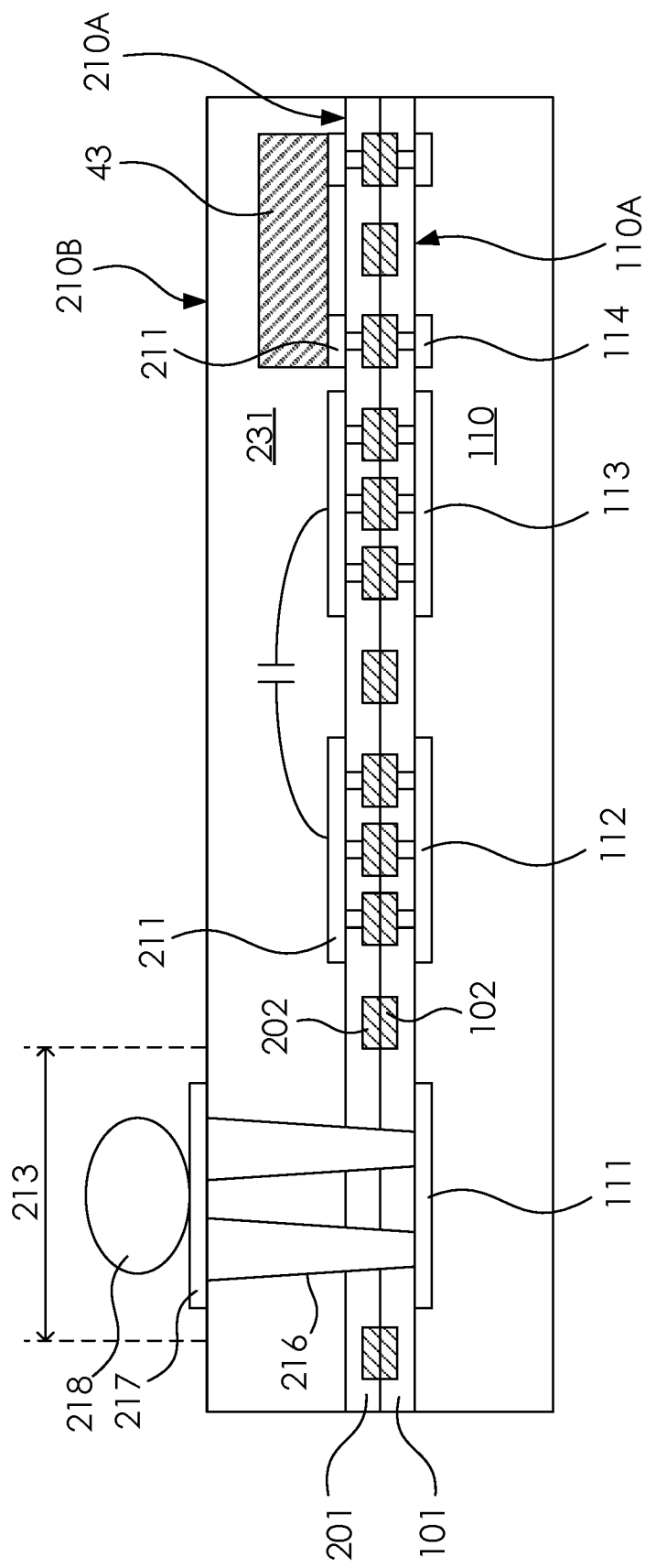
FIG. 7 illustrates a cross-sectional view of a semiconductor structure according to some embodiments of the present disclosure.

As shown in FIG. 7, in some embodiments, the semiconductor structure may include a dynamic random access memory (DRAM) 43 electrically connected to the active wafer 110 through the first hybrid bonding layer 101 and the second hybrid bonding layer 201. In such embodiments, the DRAM 43 or a DRAM array is formed in a memory wafer 231 and electrically coupled to the capacitor top metals 211, and thereby electrically coupled to the DRAM signaling interfaces 114 in the active wafer 110 through the hybrid bonding of the wafers.

The capacitor structures shown in some embodiments of the present disclosure may be functioned as decoupling capacitors. The capacitor wafer (e.g., the IPD wafer) may have a size identical to the active wafer. By using dense capacitor technology which may provide a capacitor as much as 1 μF/mm$^2$ in density, through bonding the capacitor wafer on the active wafer, a very large capacitance may be achieved. For example, the capacitance may be more than 100 times compared to a planar MIM capacitor. Moreover, each of the bonding pitches may be smaller than 3 μm and a large number of connections between the capacitor wafer and the active wafer may be formed thereby. For example, millions of connections may be formed in typical die sizes of about 100 mm$^2$ to about 800 mm$^2$ and thus an ideal capacitor with low impedance (e.g., both ESR and ESL are as close to zero as possible) may be achieved. Furthermore, by using the hybrid bonding as disclosed in the present disclosure, the original layout design of the active wafer can be retained by adjusting only the layout of the capacitor wafer. For example, the original layout design of the C4 bumps on the active wafer (e.g., the VDU and VSS connection sites of the active water) may be retained by designing the keep-out zones and the BTSVs in the capacitor wafer to match with the layout design of the C4 bumps.

The keep-out zones and the BTSVs structure in the capacitor wafer can at least achieve two advantages: (1) the layout design of the active wafer can be retained since the external signal and power supply connection of the active wafer can be made through the BTSVs at the keep-out zones of the capacitor wafer, no material changes to active wafer or active chip design is required; and (2) being unaffected by the stacking of the capacitor wafer or capacitor die, the backside of the active wafer or active die can remain closely coupled to the heat dissipation mechanism (e.g., a heat sink) so as to effectively dissipate the heat generated in the active region.

Figure 8A:
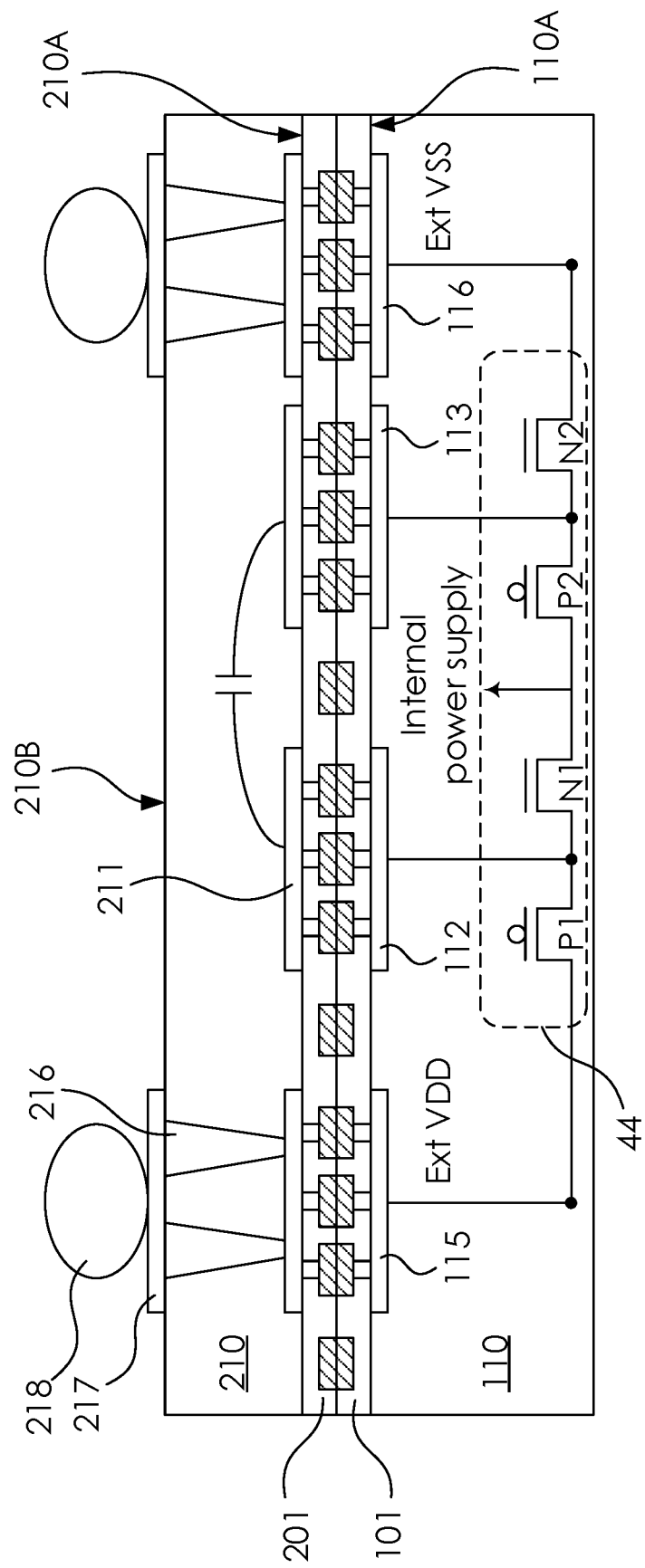
FIG. 8A illustrates a cross-sectional view of a semiconductor structure according to some embodiments of the present disclosure.
Figure 8B:
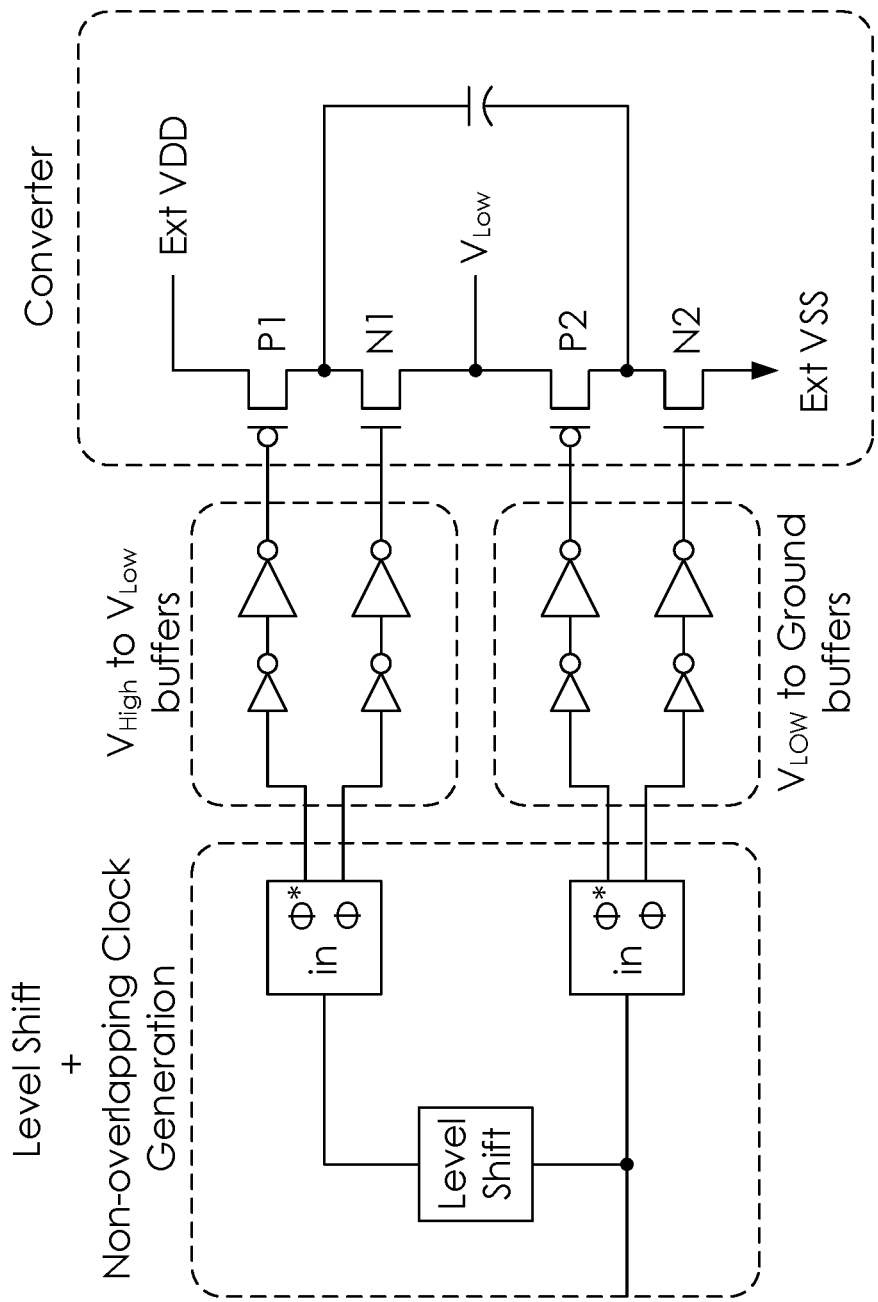
FIG. 8B illustrates a circuit diagram of a semiconductor structure according to some embodiments of the present disclosure.

As shown in FIGS. 8A and 8B, in some embodiments, the semiconductor structure may include at least one transistor 44. The transistor 44 and the capacitor structure in the IPD wafer 210 may commonly form a switched capacitor voltage regulator (SCVR), which may provide a regulated voltage based on external bias obtained from the external signal connections (i.e., the conductive pad 217 and the conductive bump 218 electrically coupled to the BTSVs 216). The capacitor structures in the IPD wafer 210 is intended to be adopted as flying capacitors (FC). An output voltage level of the SCVR may be adjusted through register settings.

Note the right portion (i.e. the converter) of FIG. 8B illustrates the SCVR formed in the active wafer 110 and the IPD wafer 210. The components for controlling the SCVR, such as the module for level-shift plus non-overlapping clock generation and the buffers directly neighboring to the converter shown in the left and the middle portions of FIG. 8B respectively, may be also formed in the active wafer 110 (not shown).

Figure 8C:
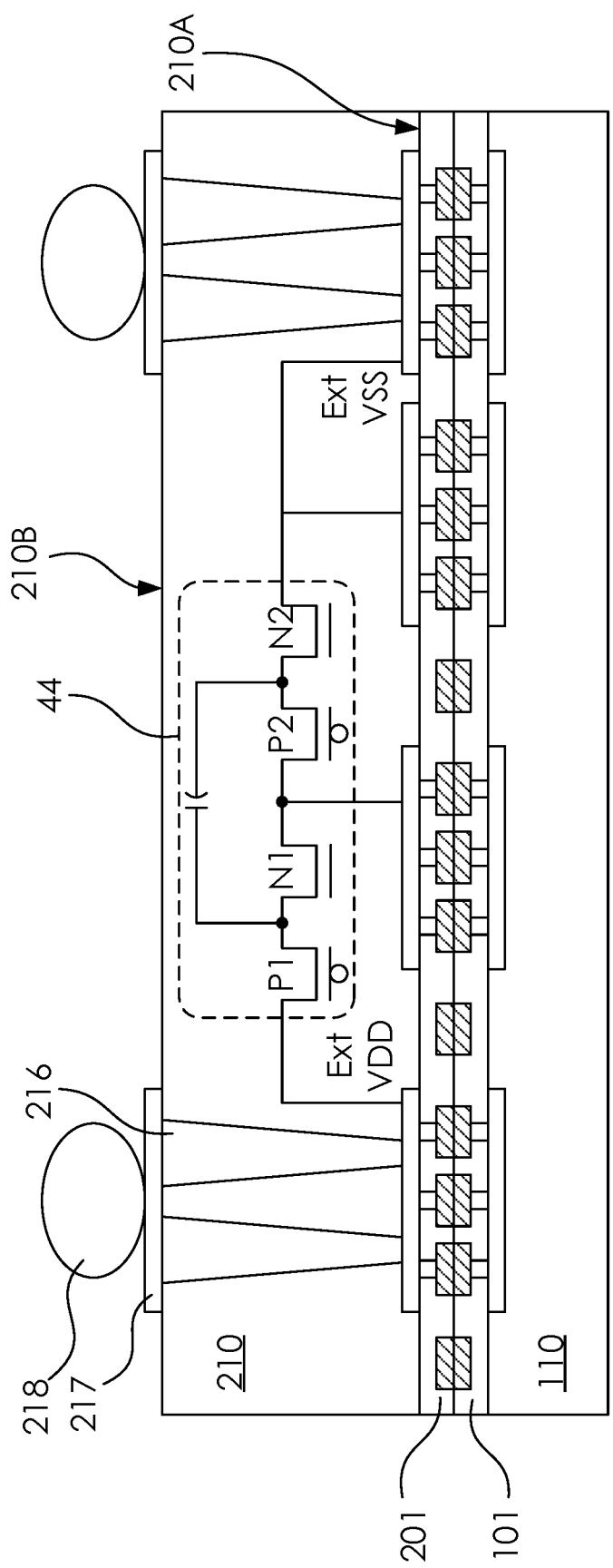
FIG. 8C illustrates a cross-sectional view of a semiconductor structure according to some embodiments of the present disclosure.

In some embodiments, the transistor 44 is electrically coupled to the capacitors through the VDD pad 112 and the VSS pad 113, and electrically coupled to the external signal connections through an extVDD pad 115 and an extVSS pad 116 at the front side 110A of the active water 110. As shown in FIG. 8C, in some embodiments, the transistor 44 may be formed in the IPD wafer 210. In other embodiments, the transistors 44 may be formed in both of the active wafer 110 and the IPD wafer 210. Likewise, the components for controlling the SCVR may be formed in the active wafer 110 and/or the IPD wafer 210.

According to the embodiments as afore discussed, the semiconductor structure in the present disclosure may include an active die and a capacitor die, or in some alternative embodiments, may include an active wafer and a capacitor wafer, while the size of the active die is identical to the capacitor die. The active wafer and the capacitor wafer are bonded by 3D packaging technique such as wafer-on-wafer bonding through the hybrid bonding layers. The terminals of the capacitor may be connected to the active die by metal connections.

Furthermore, as illustrated in some embodiments, the capacitor wafer may include a memory structure, and the interface signals of the memory structure are also connected to the active wafer through wafer-on-wafer bonding.

Figure 9:
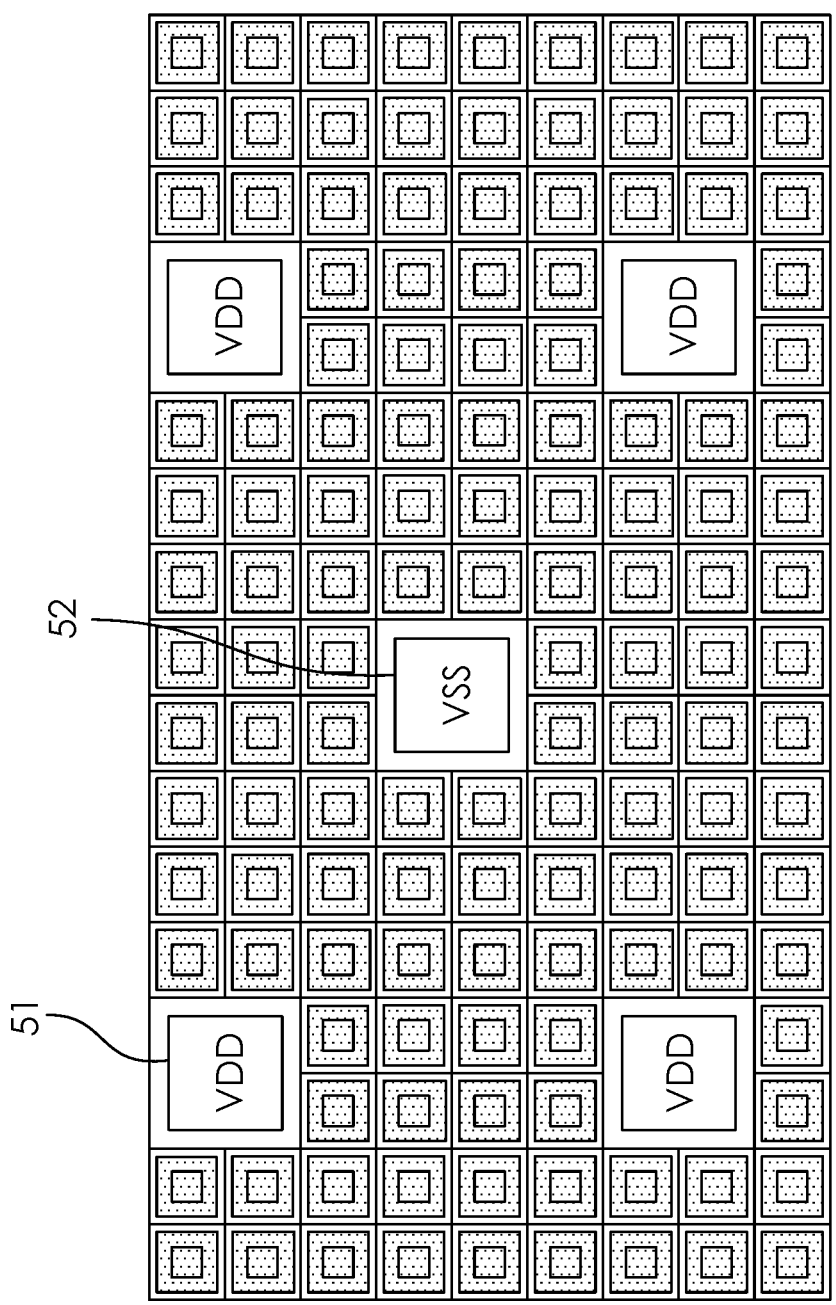
FIG. 9 illustrates a layout of a capacitor die according to some embodiments of the present disclosure.

FIG. 9 illustrates a layout of a capacitor die 200 in some embodiments. The capacitor die 200 may include a plurality of gaps 51, 52 that may be utilized to form a plurality of via holes by via etching operations and further form the TSVs subsequently. As previously described, the gaps 51, 52 can be the keep-out zones and the BTSVs structure in the capacitor wafer, and hence no material change of the layout of the active die is required.

Figure 10A:
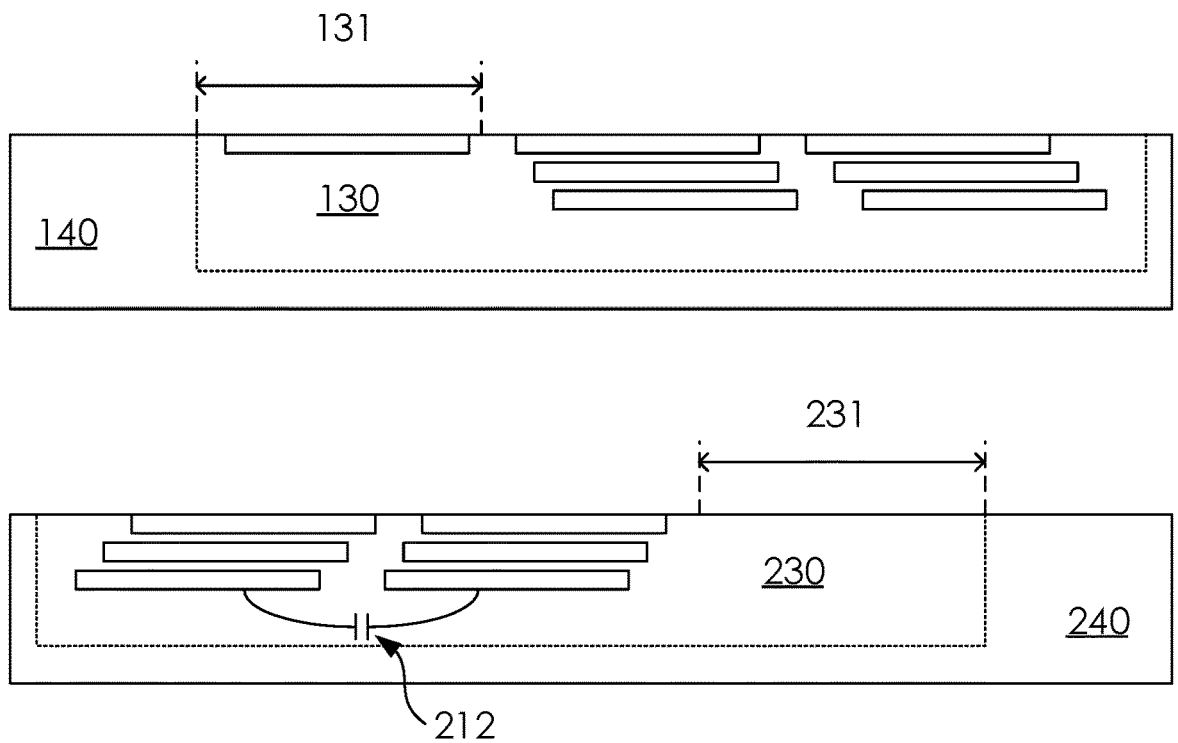
FIGS. 10A to 10E illustrate cross-sectional views of forming a semiconductor structure according to some embodiments of the present disclosure.

In manufacturing the semiconductor structure as shown in FIG. 4, the operations thereof may refer to FIGS. 10A to 10E. As shown in FIG. 10A, in some embodiments, prior to the hybrid bonding operation, a logic structure 130 (i.e., the active die) and a capacitor structure 230 (i.e., the capacitor die) are formed on a first wafer 140 (e.g., the active wafer) and a second wafer 240 (e.g., the IPD wafer), respectively. Each of the first wafer 140 and the second wafers 240 may include a plurality of die regions, and the present disclosure only shows one of the die regions in the illustration. In some embodiments, within the region of each of the logic structure 130, a first reserved region 131 may be included. Likewise, a second reserved region 231 may be included within the region of each of the capacitor structure 230. The first reserved region 131 and the second reserved region 231 are reserved for forming the BTSV in following operations because the distribution of the bonding pads may be associated with the location of the BTSV. Since the distribution of the first and the second bonding pads 102, 202 in the first and the second hybrid bonding layers 101, 201 shall be mirror images to each other, the aforesaid reserved regions 131, 231 may be planned before hand when designing the layout of each of the logic structure 130 and the capacitor structure 230.

Figure 10B:
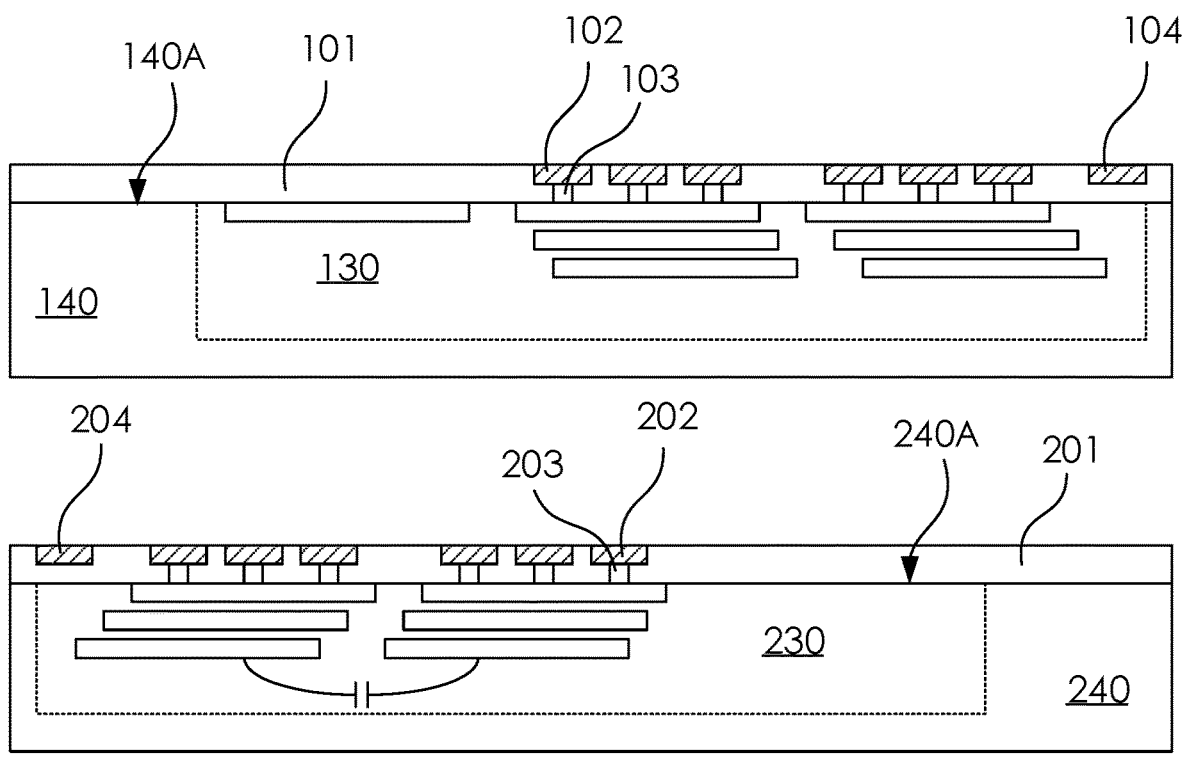

As shown in FIG. 10B, in some embodiments, the first hybrid bonding layer 101 is formed over the front side 140A of the first wafer 140. Likewise, the second hybrid bonding layer 201 is formed over the front side 240A of the second wafer 240. In some embodiments, the first hybrid bonding layer 101 includes the first bonding pads 102. In some embodiments, the first hybrid bonding layer 101 further includes a plurality of first conductive vias 103 connected to the first bonding pads 102. Similarly, in some embodiments, the second hybrid bonding layer 201 includes a plurality of second conductive vias 203 connected to the second bonding pads 202. The first and the second conductive vias 103, 203 in such embodiments may strengthen the connectivity from the first and the second bonding pads 102, 202 to the top metals in the first wafer 140 and the second wafer 240.

Moreover, in some embodiments, the first hybrid bonding layer 101 may further include a third bonding pad 104 which is electrically disconnected from the logic structure 130. That is, the third bonding pad 104 is a dummy bonding pad that only serving the purpose for hybrid bonding, without being coupled to the top metals in the first wafer 140. Similarly, the second hybrid bonding layer 201 may further include a fourth bonding pad 204 which is electrically disconnected from the capacitor structure 230. The third bonding pad 104 may be utilized to be hybrid bonded to the fourth bonding pad 204 in subsequent hybrid bonding operation.

Figure 10C:
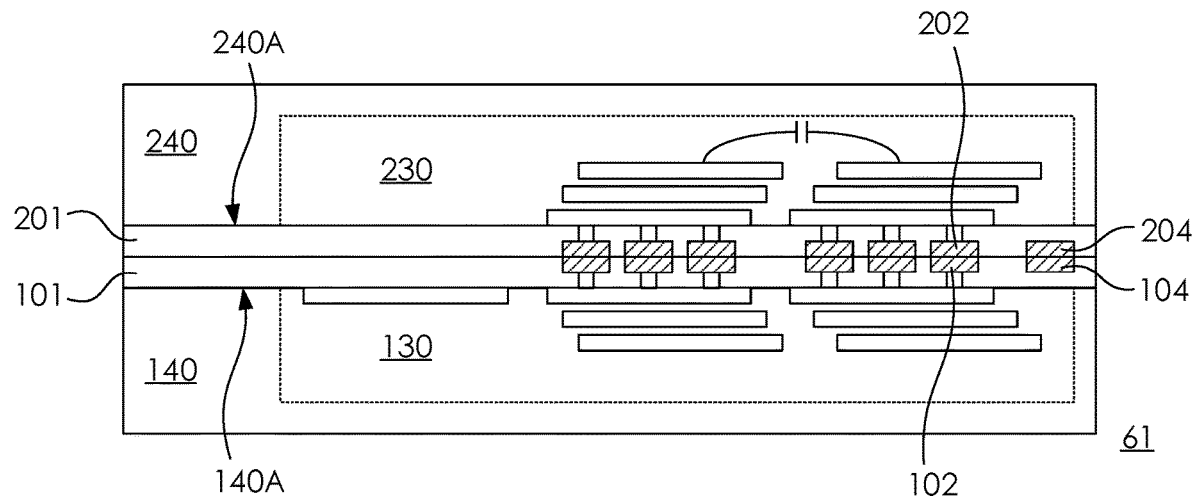

As shown in FIG. 10C, the second wafer 240 is flipped to be stacked on the first wafer 140 by a hybrid bonding operation, wherein the front side 140A of the first wafer 140 is facing the front side 240A of the second wafer 240 and a face-to-face stack is thus performed. In such stacking, the first bonding pads 102 are in contact with the second bonding pads 202 for hybrid bonding and electrical connection, whereas the third bond pads 104 are in contact with the fourth bonding pads 204 solely for hybrid bonding. In some embodiments, the first wafer 140 and the second wafer 240 are hybrid bonded under suitable conditions.

By hybrid bonding the first water 140 and the second wafer 240 through the hybrid bonding operation as above-mentioned, the first hybrid bonding layer 101 on the first wafer 140 and the second hybrid bonding layer 201 on the second wafer 240 are connected, and a first bonded wafer 61 is obtained thereby. In some embodiments, the first bonded wafer 61 may be singulated subsequently to obtain a plurality of semiconductor structures, wherein each of them includes an active die 100 and a capacitor die 200 as previously shown in FIG. 1. In other embodiments, and will be discussed in FIG. 11 to FIG. 16, prior to the singulation operation, there may be additional wafers similar to the second wafers 240 bonded over the first bonded wafer 61 to stack extra number of capacitor dies over the active die on a wafer-to-wafer basis, depending on the product requirement and current state of the art.

Figure 10D:
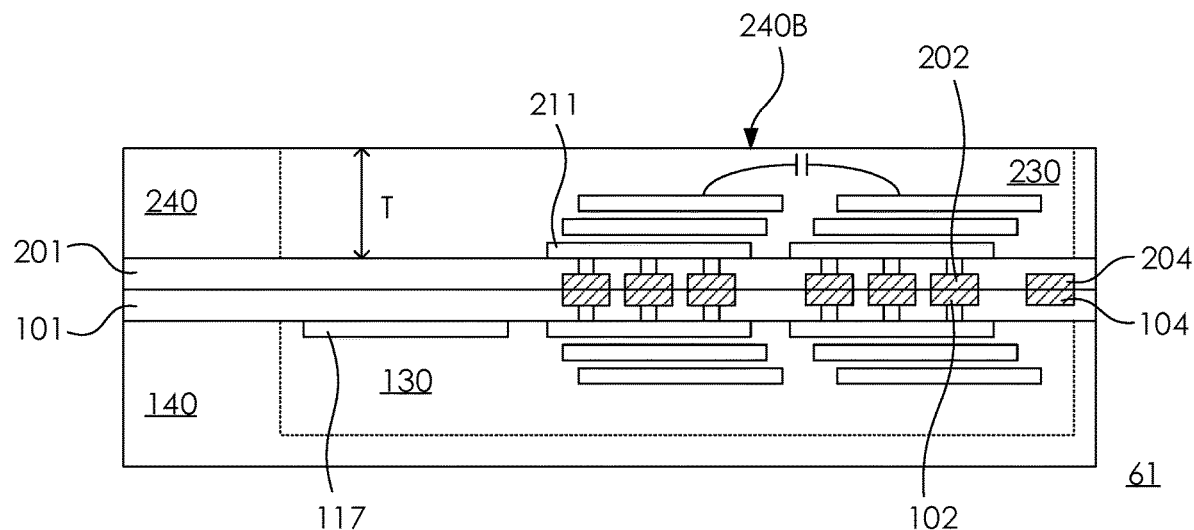

As shown in FIG. 10D, in some embodiments, the second wafer 240 in the first bonded wafer 61 is thinned from a back side 240B for forming BTSVs after bonding the first wafer 240 and the second water 240. The thinning operation may be implemented by mechanical polishing, chemical-mechanical polishing (CMP), wet etching, dry etching, or combination thereof. In some embodiments, the second wafer 240 is thinned such that a thickness between a metal 117 (e.g., a top metal) in the first wafer 140 and the back side 240B of the second wafer 240 is suitable for subsequent BTSV 216 trench formation. In some embodiments, after the thinning of the second wafer 240, the thickness T of the second wafer 240 can be less than 10 μm.

Figure 10E:
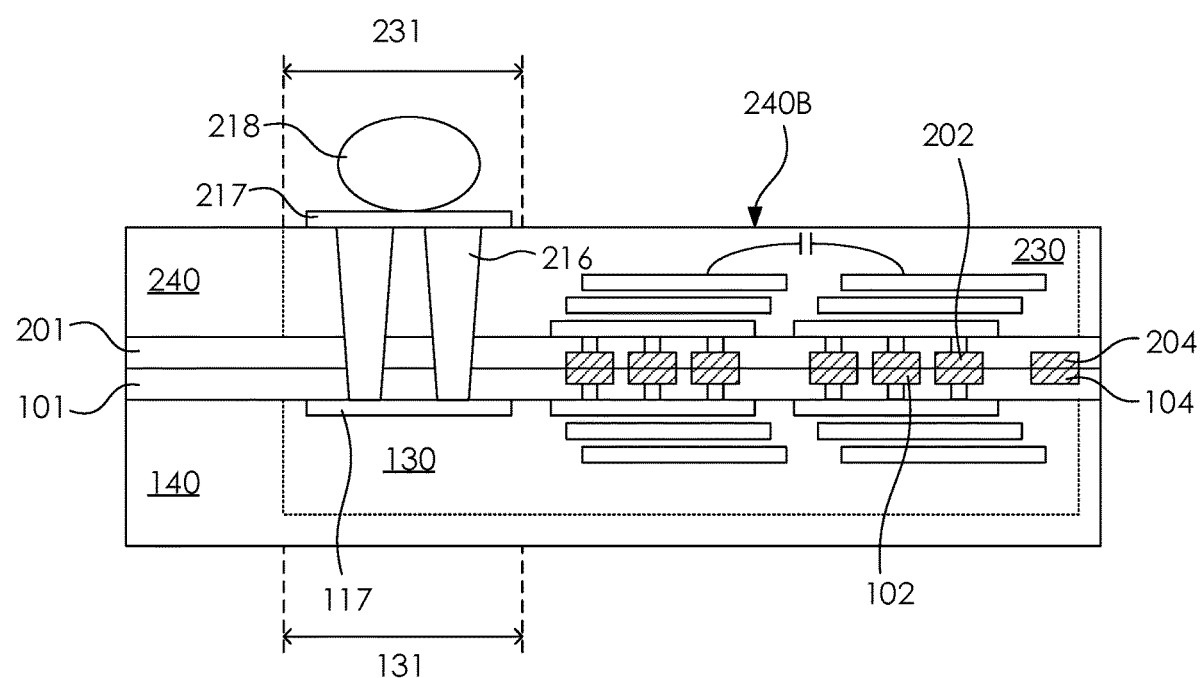

As shown in FIG. 10E, at least a BTSV 216 may be formed from the back side 240B of the second wafer 240 to a metal 117 in the first wafer 140. In some embodiments, the metal 117 is in the ILD of the first wafer 140. In some embodiments, the metal 117 is at the first front side 140A of the first wafer 140. In some embodiments, the BTSV 216 is formed at the second reserved region 231 and in contact with the metal 117 at the first reserved region 131. In some embodiments, the BTSV 216 is formed through a via etching operation, and then the via holes are filled with conductive materials through electroplating operations. In some embodiments, the conductive pad 217 may be formed on the back side 240B of the second wafer 240 to electrically connect to the BTSV 216. Next, the conductive bump 218 may be disposed in contact with the conductive pad 217 for electrically connected to other semiconductor structures or devices such as an interposer or a PCB.

Figure 11:
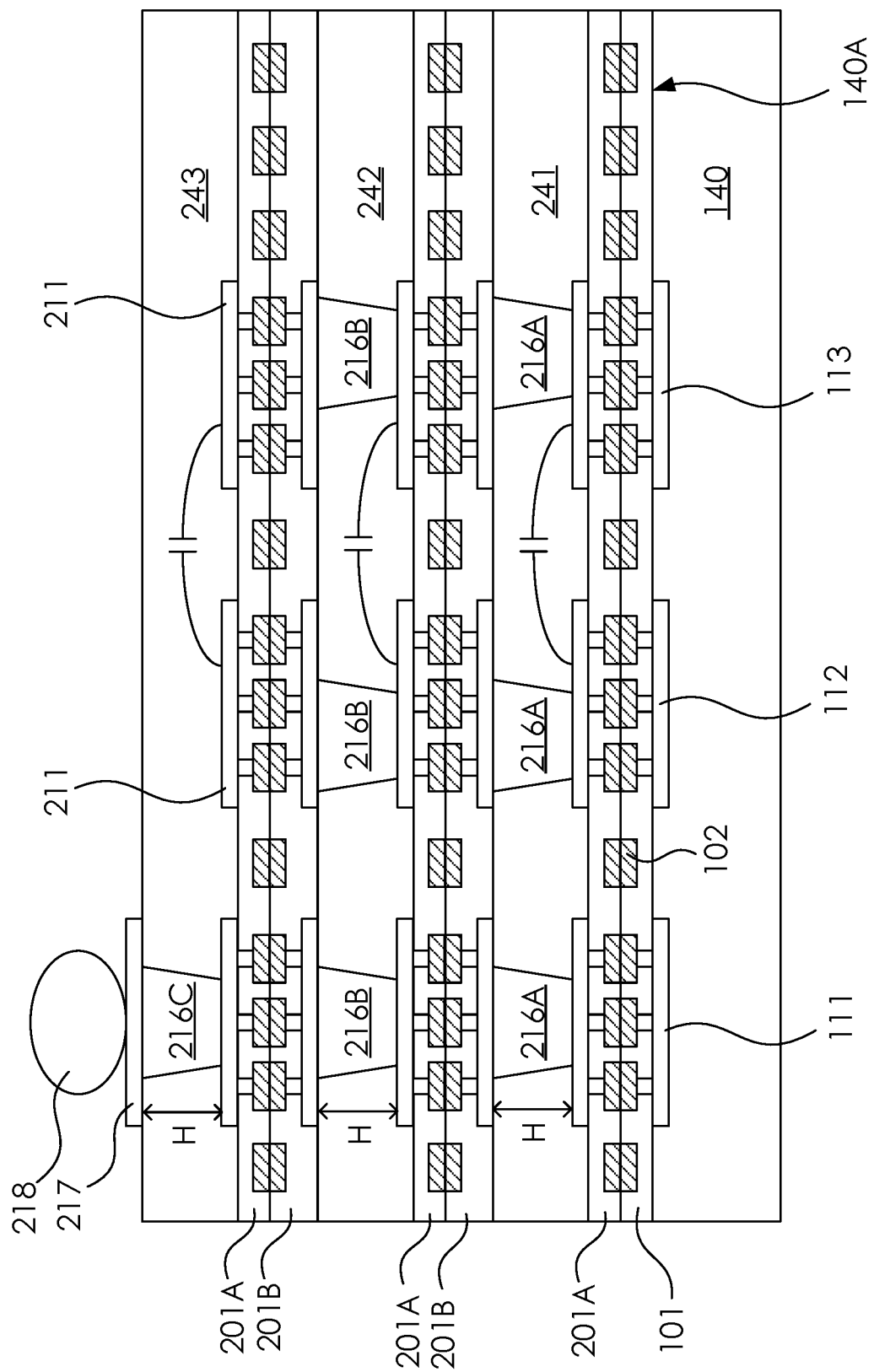
FIG. 11 illustrates a cross-sectional view of a semiconductor structure according to some embodiments of the present disclosure.

As shown in FIG. 11, in some embodiments, more than one capacitor wafers (i.e., the second wafers 241, 242, 243) may be stacked over the active water (i.e., the first wafer 140) with face-to-back arrangements between the capacitor wafers to form a stacked semiconductor structure. The present disclosure uses different numbers to differentiate the second wafers that stacked over the active wafer. In such embodiments, each two of the second wafers 241, 242, 243 are electrically connected through the hybrid bonding operations, and each of the second wafers 241, 242, 243 include at least a BTSV 216A, 216B, 216C for electrically connecting the hybrid bonding layers.

FIGS. 12A to 12J illustrate the manufacturing operations in preparation of the stacked semiconductor structure of FIG. 11. As shown in FIGS. 12A to 12E, the second wafer 241 may be stacked over the first wafer 140 through hybrid bonding operations and be thinned from the back side 241B of the second wafer 241 prior to forming the BTSVs 216A in the second wafer 241. In some embodiments, the height H in the second wafer 240 for forming the BTSVs is thinned to be less than about 10 μm in the thinning operation. The details of the operations may refer to the descriptions on FIGS. 10A to 10E and are omitted here for brevity.

Figure 12A:
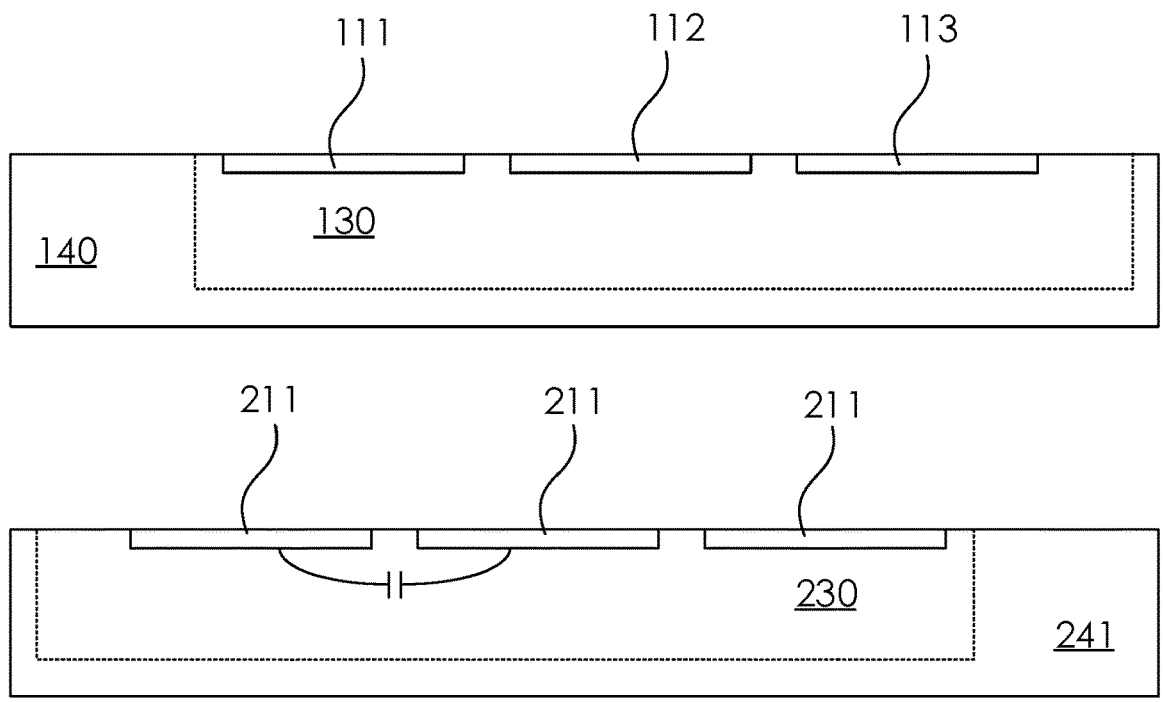
FIGS. 12A to 12J illustrate cross-sectional views of forming a semiconductor structure according to some embodiments of the present disclosure.
Figure 12B:
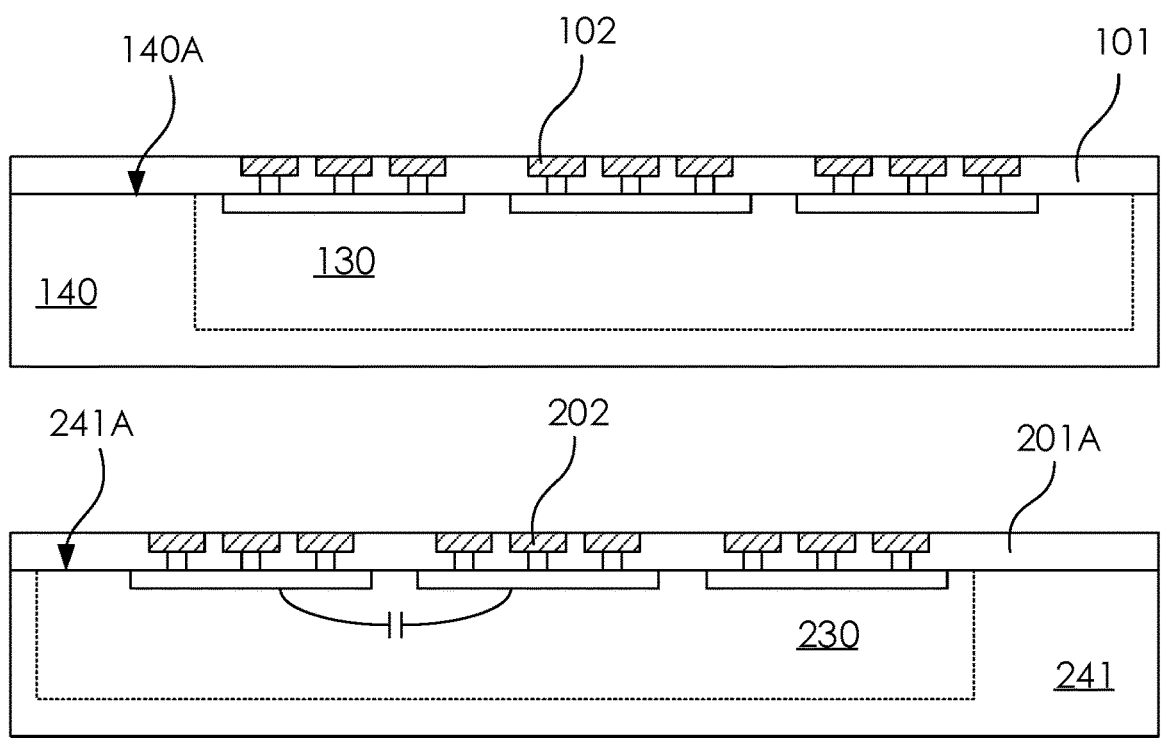
Figure 12C:
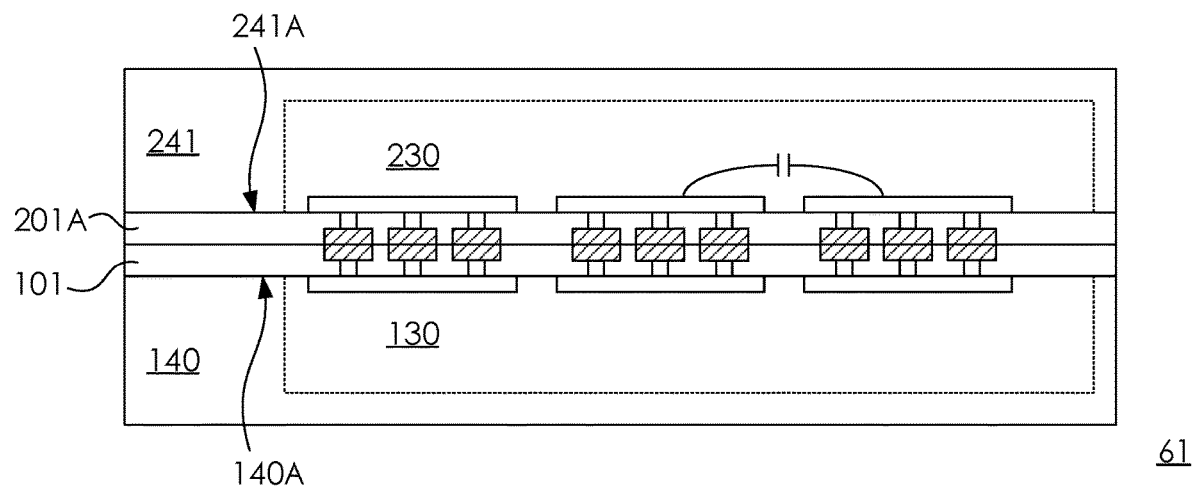
Figure 12D:
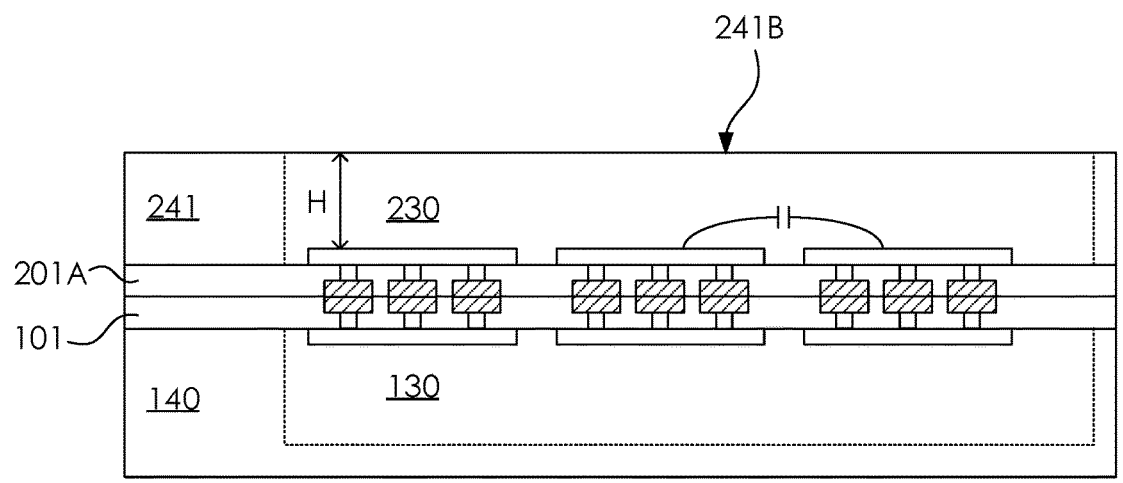
Figure 12E:
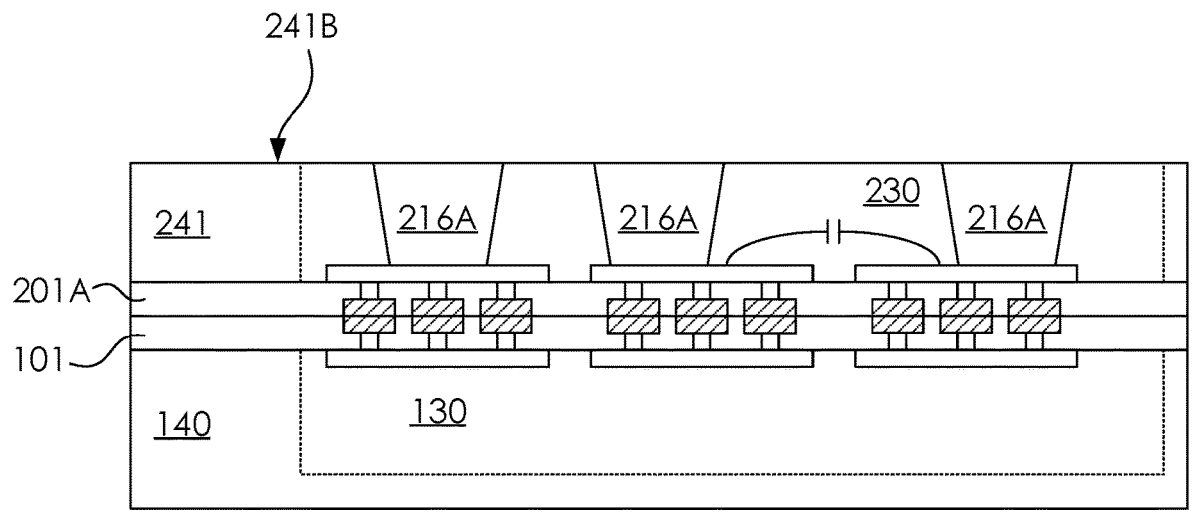
Figure 12F:
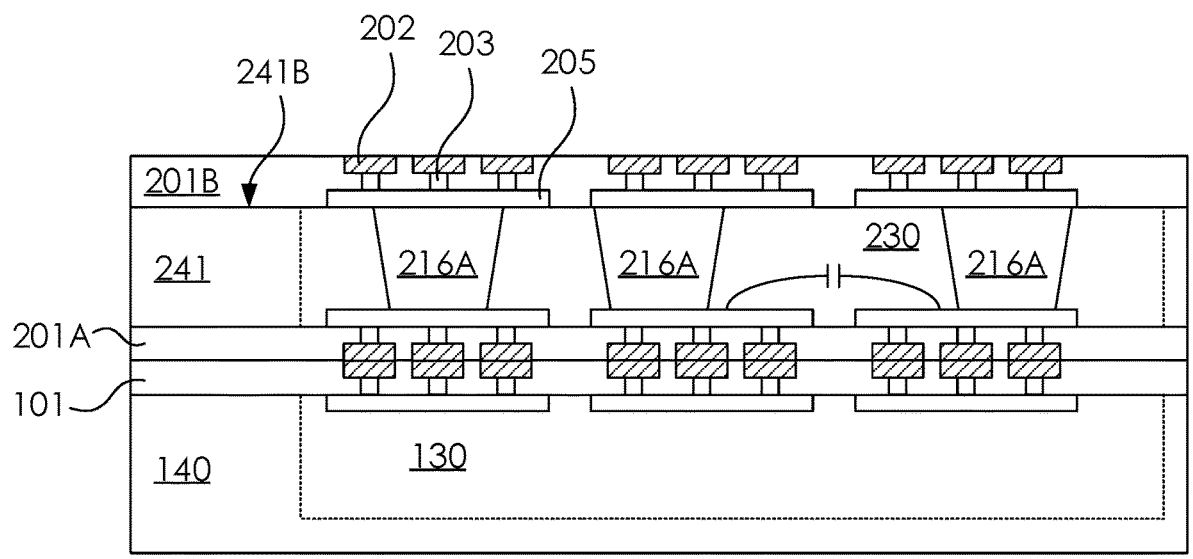
Figure 12G:
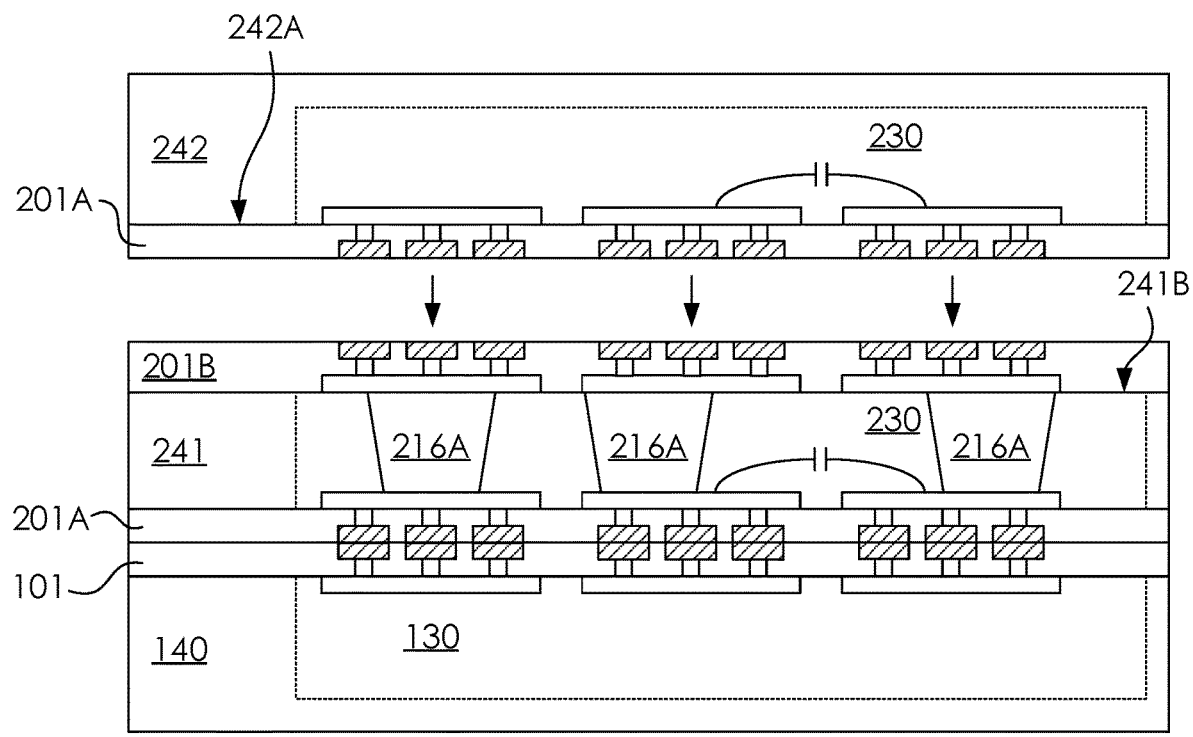

As shown in FIG. 12F, in some embodiments, after the BTSVs 216A are formed in the second wafer 241, a fourth hybrid bonding layer 201B may be formed on the back side 24B of the second wafer 241. The fourth hybrid bonding layer 201E may include a plurality of metal layers 205 formed proximal to the exposed surfaces of the BTSVs 216A to connect the BTSVs 216A of the second wafer 241 and the plurality of second conductive vias 203. That is, the plurality of second conductive vias 203 connected to the second bonding pads 202 are formed on the metal layer 205 instead of on the exposed surfaces of the BTSVs 216A directly. The exposed second bonding pads 202 are used for hybrid bonding with a third hybrid bonding layer 201A formed on a front side 242A of another second wafer 242, as illustrated in FIG. 12G. The third hybrid bonding layer 201A is substantially identical to the second hybrid bonding layer 201 as shown in previous embodiments, which includes the plurality of second bonding pads 202 and the plurality of second conductive vias 203 without having the metal layer 205.

Figure 12H:
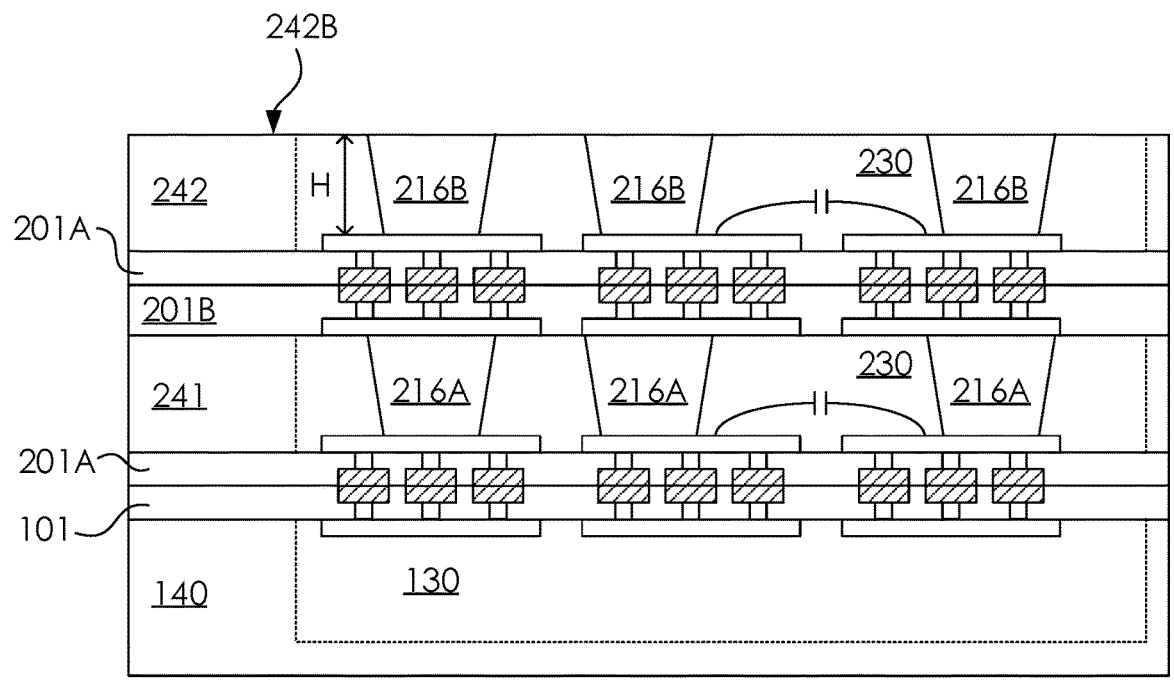
Figure 12I:
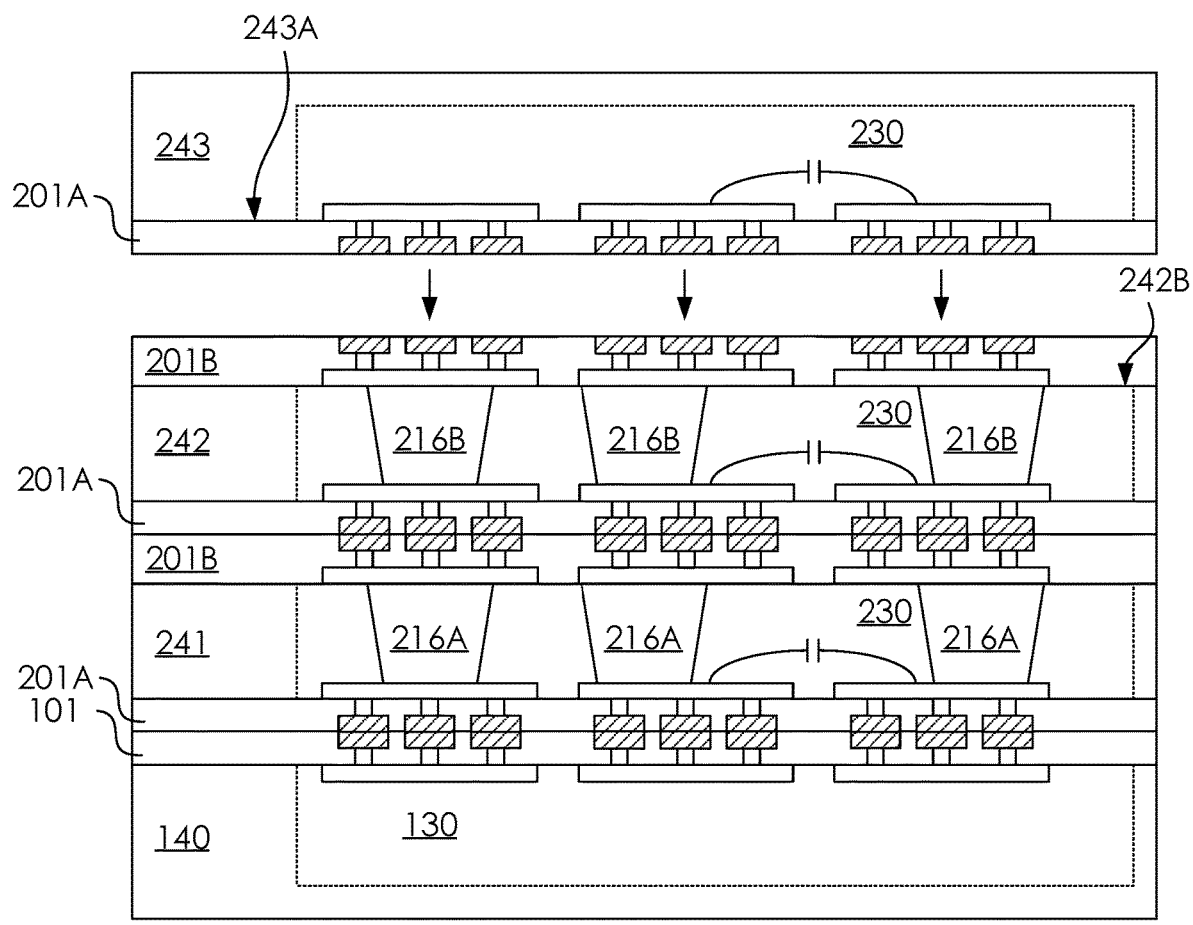
Figure 12J:
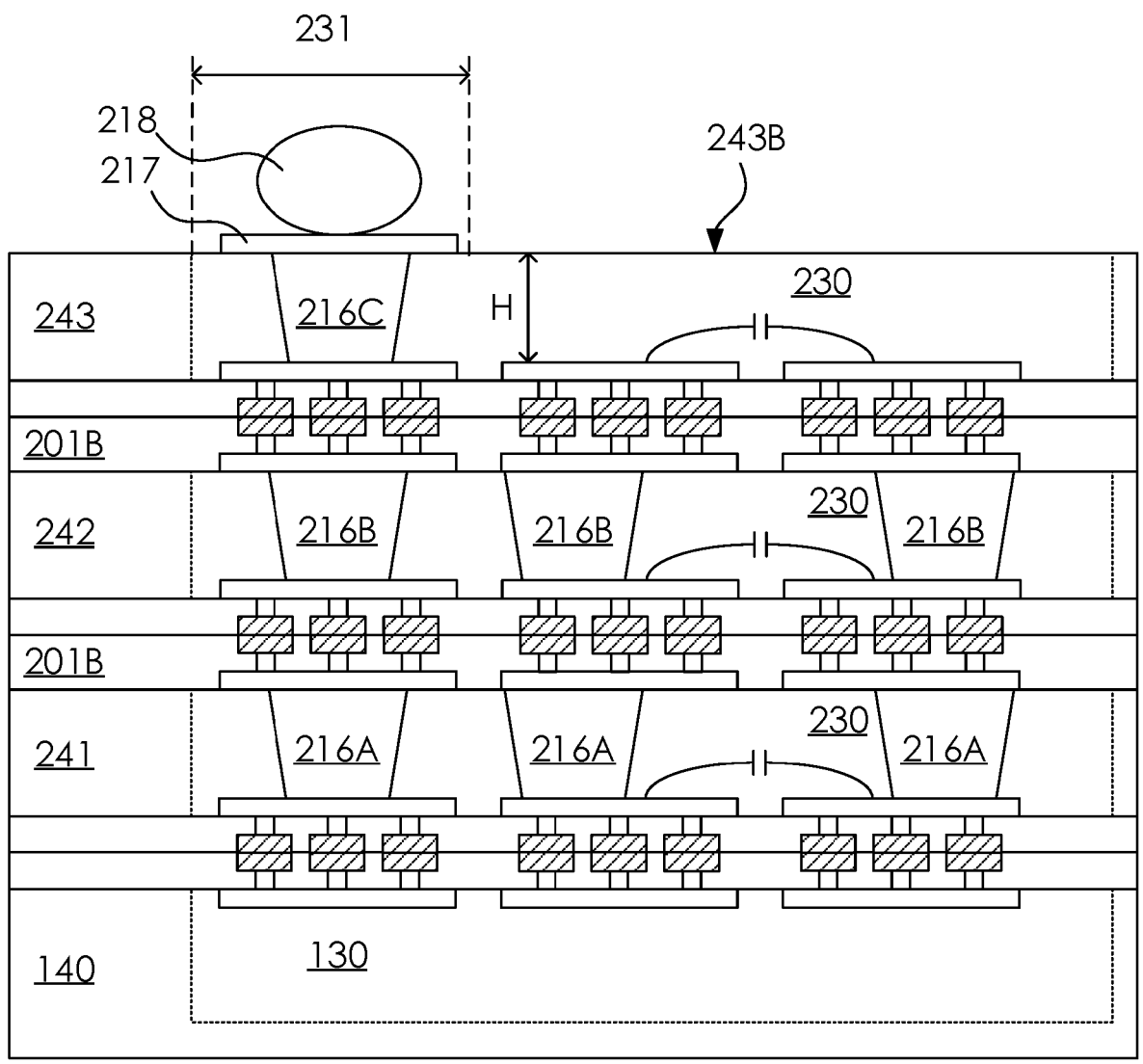

As shown in FIG. 12H, the second wafer 242 stacked over the second wafer 241 with a face-to-back arrangement may be thinned from the back side 242B for forming the BTSVs 216B in the second wafer 242 as same as the operations of forming the BTSVs 216A as shown in FIG. 12E. Likewise, another second wafer 243 may be further stacked over the second wafer 242 with a face-to-back arrangement through the hybrid bonding structure including the fourth hybrid bonding layer 201B and the third hybrid bonding layer 201A between the wafers to form the stacked wafer as shown in FIG. 12I. Next, as shown in FIG. 12J, the BTSV 216C may be formed in the second wafer 243, particularly, in the second reserved region 231 for further electrically connected to the conductive pad 217 and the conductive bump 218 formed at the back side 243B of the second wafer 243. The operations regarding the details of forming of the conductive pad 217 and the conductive bump 218 may refer to FIG. 10E and are omitted here for brevity.

Figure 13:
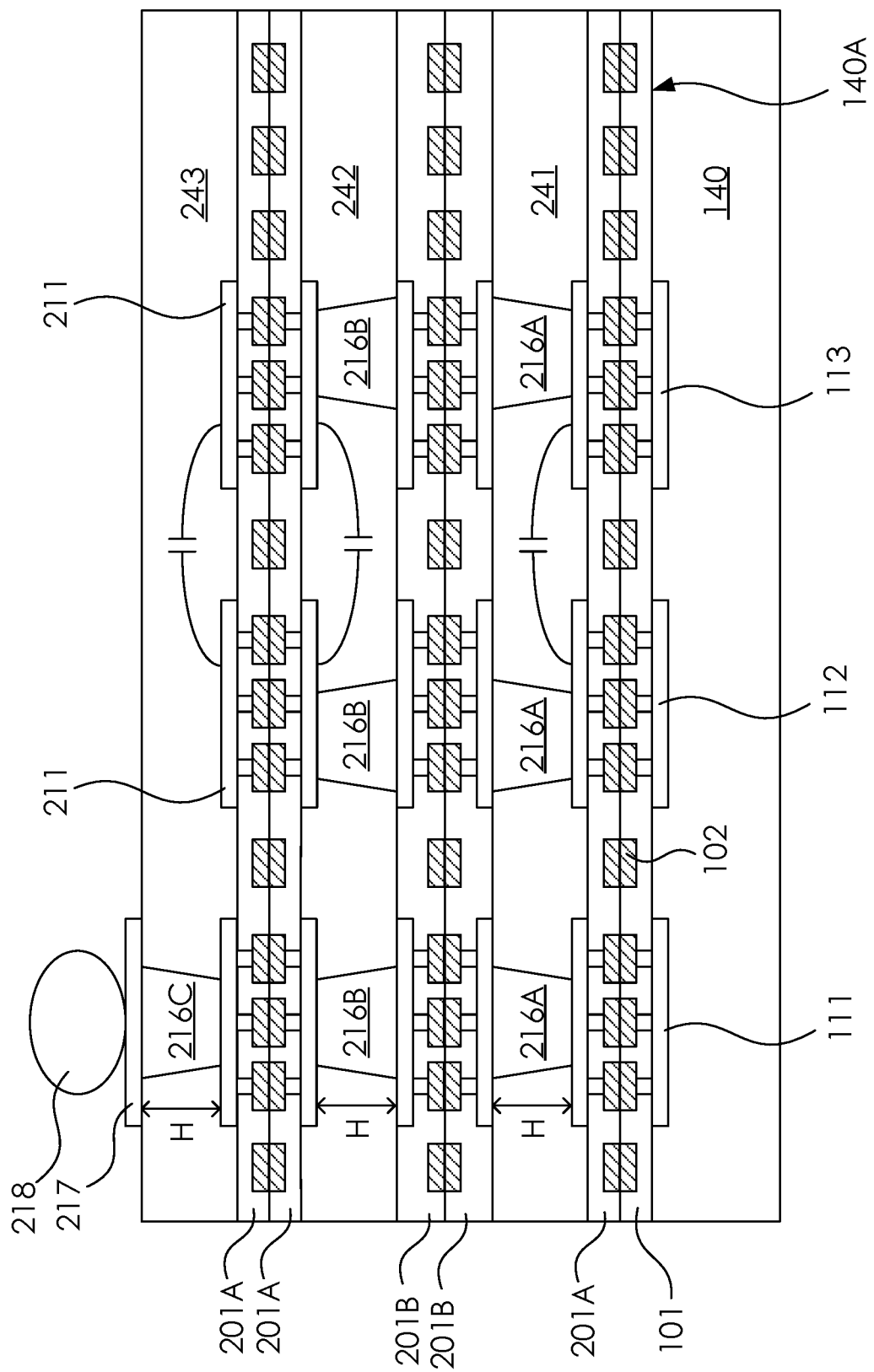
FIG. 13 illustrates a cross-sectional view of a semiconductor structure according to some embodiments of the present disclosure.

As shown in FIG. 13, in some embodiments, more than one capacitor wafers (i.e., the second wafers 241, 242, 243) may be stacked over the active wafer (i.e., the first wafer 140) with a mixture of face-to-face and back-to-back arrangements to form a stacked semiconductor structure. For instance, in such embodiments, the second wafer 241 is stacked over the first wafer 140 with a face-to-face arrangement, while the second wafer 242 is stacked over the second wafer 241 with a back-to-back arrangement. Due to the various arrangements between the wafers, the hybrid bonding structures between the wafers are different; for instance, the hybrid bonding structure between the first wafer 140 and the second wafer 241 may include the first hybrid bonding layer 101 in contact with the third hybrid bonding layer 201A that identical to the embodiment previously shown in FIG. 11, while the hybrid bonding structure between the second wafer 241 and the second wafer 242 may include two fourth hybrid bonding layers 201B.

The operations in forming the stacked semiconductor structures as shown in FIG. 11 and FIG. 13 may different. The second wafers 241, 242, 243 in the semiconductor structure shown in FIG. 11 are stacked over the first wafer 140 one by one, while the second wafers 242, 243 in the stacked semiconductor structure shown in FIG. 13 are stacked prior to stacking over the second wafer 241. As shown in FIGS. 14A to 14F, the second wafer 242 may be stacked over the second wafer 243 through the third hybrid bonding layers 201A on the front sides 242A, 243A of the second wafers 242, 243, and formed a second stacked wafer 62 thereby. The operations regarding the details of forming the hybrid bonding layers over the second wafers 242, 243, hybrid bonding the second wafers 242, 243, thinning the second wafer 242, and forming BTSVs 216B in the second wafer 242 may refer to FIGS. 12A to 12F and are omitted here for brevity.

Figure 14A:
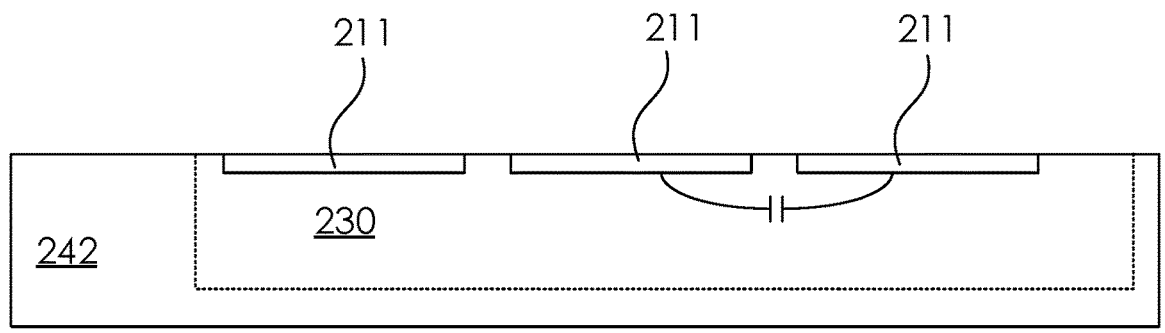
FIGS. 14A to 14G illustrate cross-sectional views of forming a semiconductor structure according to some embodiments of the present disclosure.
Figure 14A:
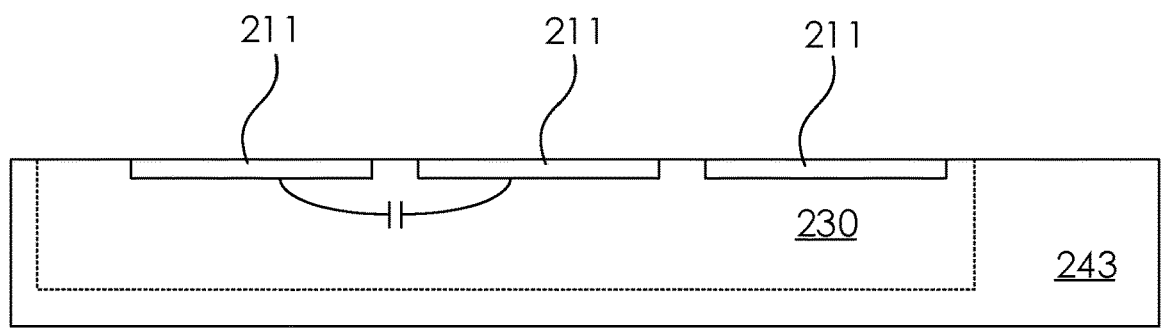
Figure 14B:
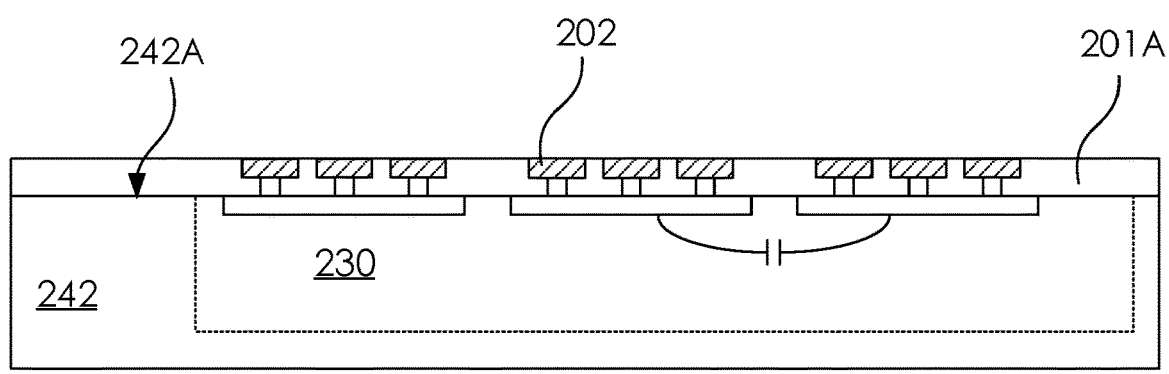
Figure 14B:
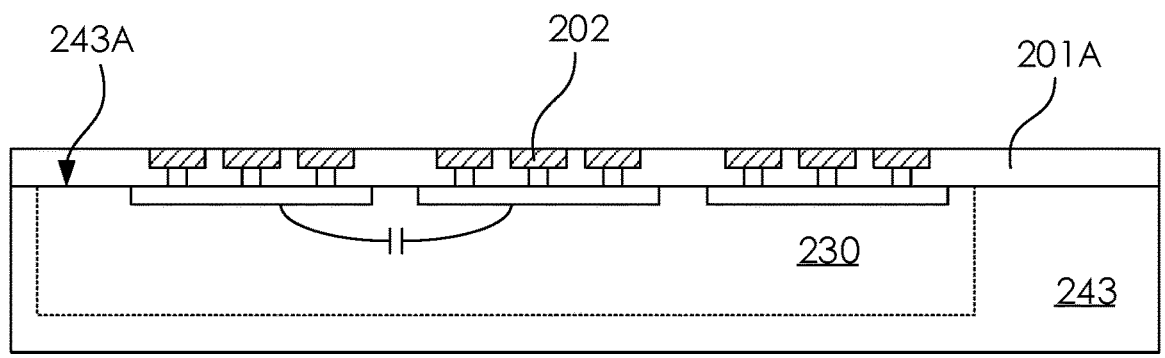
Figure 14C:
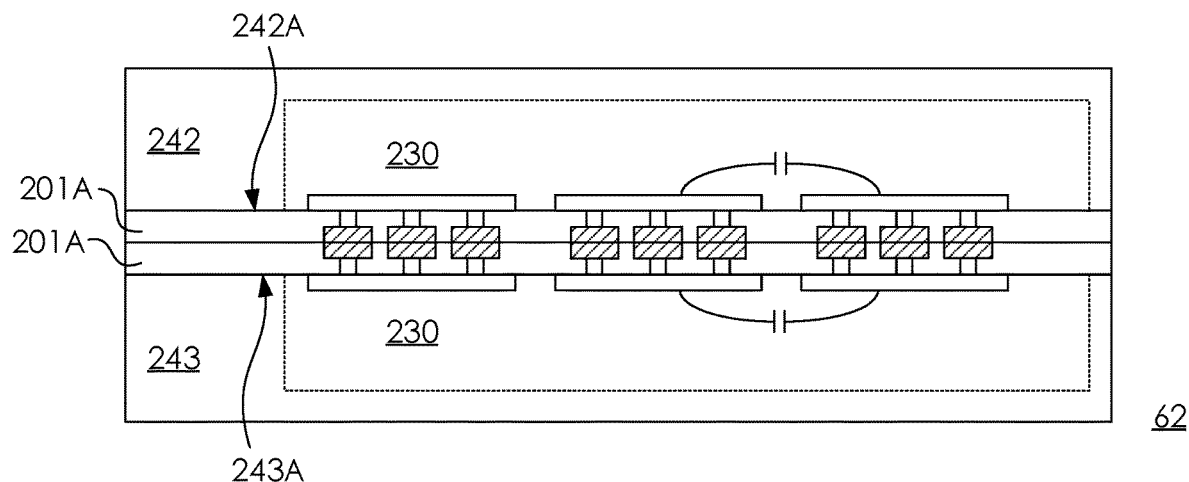
Figure 14D:
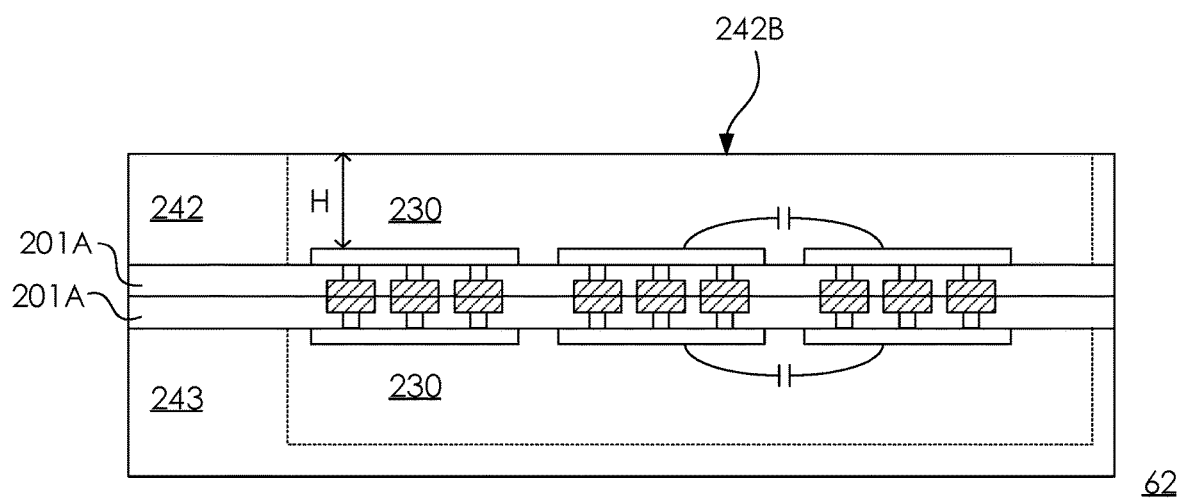
Figure 14E:
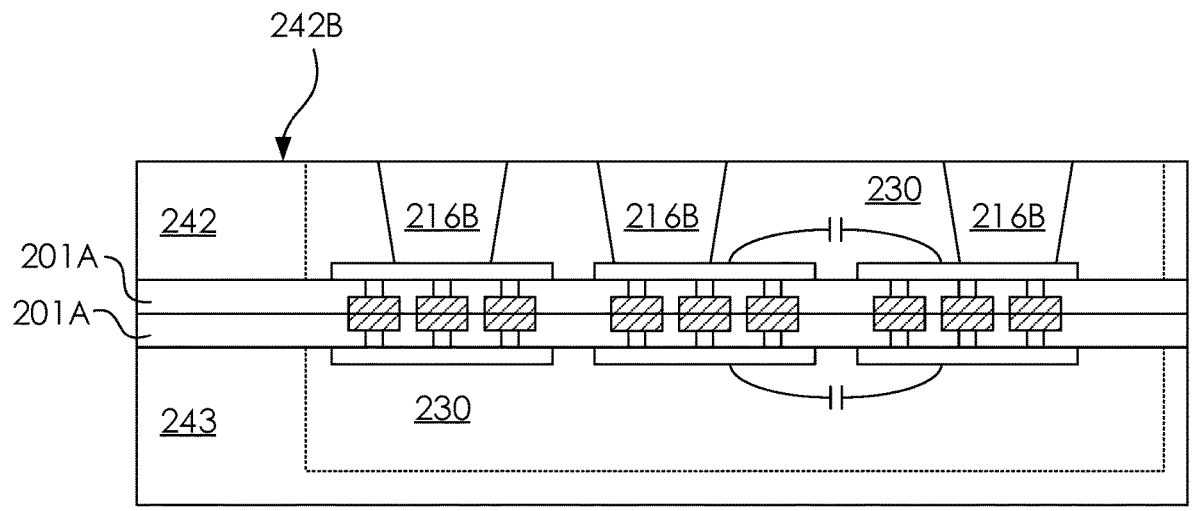
Figure 14F:
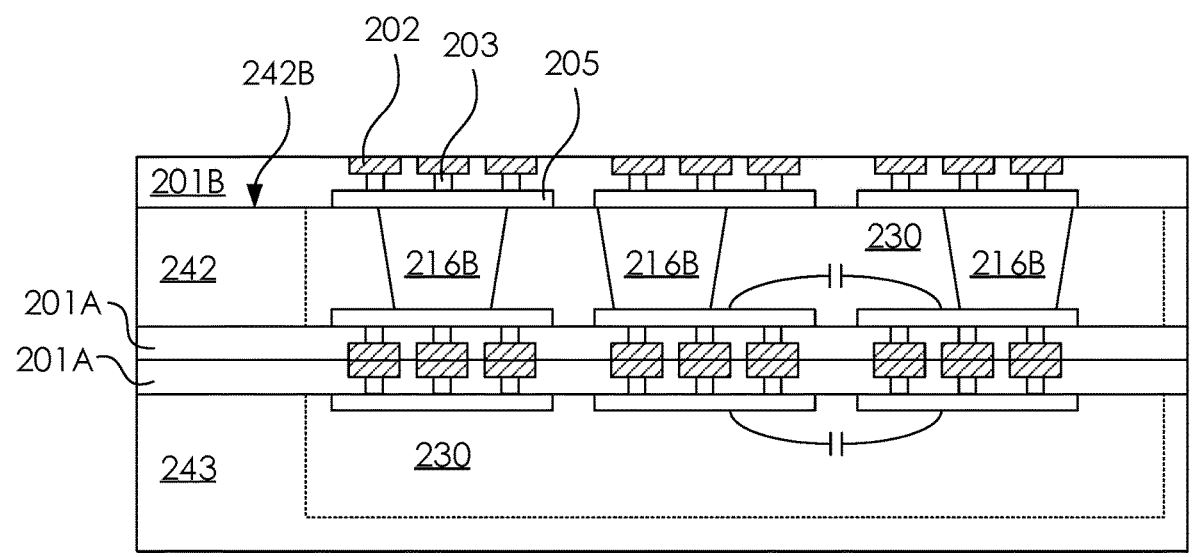
Figure 14G:
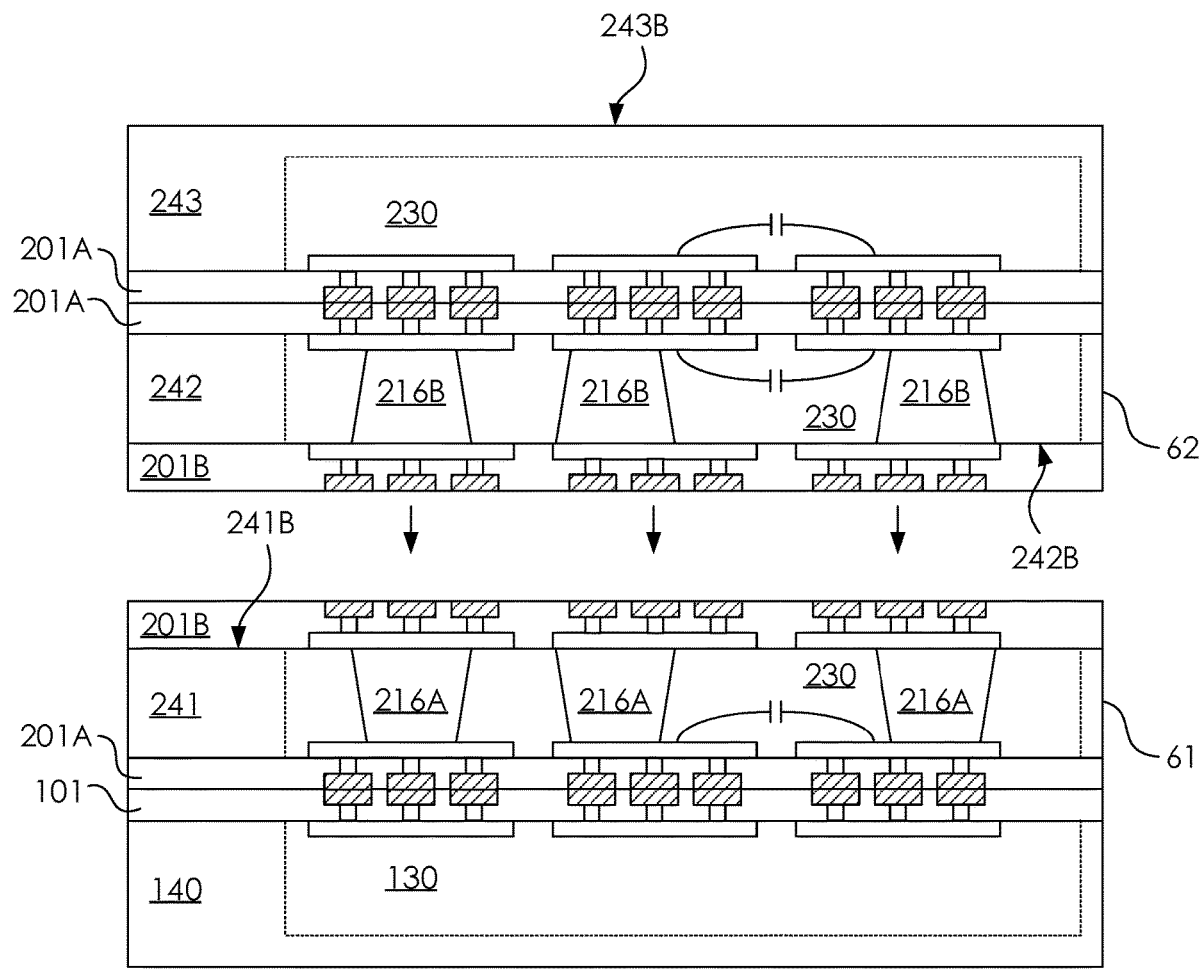

As shown in FIG. 14G, the stacked second wafers 242, 243 may be stacked over the stacked first wafer 140 and second wafer 241 to form the stacked wafer. The operations regarding the details of forming the stacked first wafer 140 and second wafer 241 may also refer to FIGS. 12A to 12F and are omitted here for brevity. In such embodiments, the fourth bonding layers 201B on the back sides 241B, 242B of the second wafers 241, 242 may be hybrid bonded through hybrid bonding operations, and therefore the second wafers 241, 242 may be stacked with a back-to-back arrangement. After the second wafers 241, 242, 243 are all stacked over the first wafer 140, the second wafer 243 may be thinned from the back side 243B thereof to form the BTSV 216C and the electrode thereon. The operations regarding the details of thinning the second wafer 243, forming the BTSV 216C, and forming of the conductive pad 217 and the conductive bump 218 may refer to FIGS. 10D to 10E and are omitted here for brevity.

Figure 15:
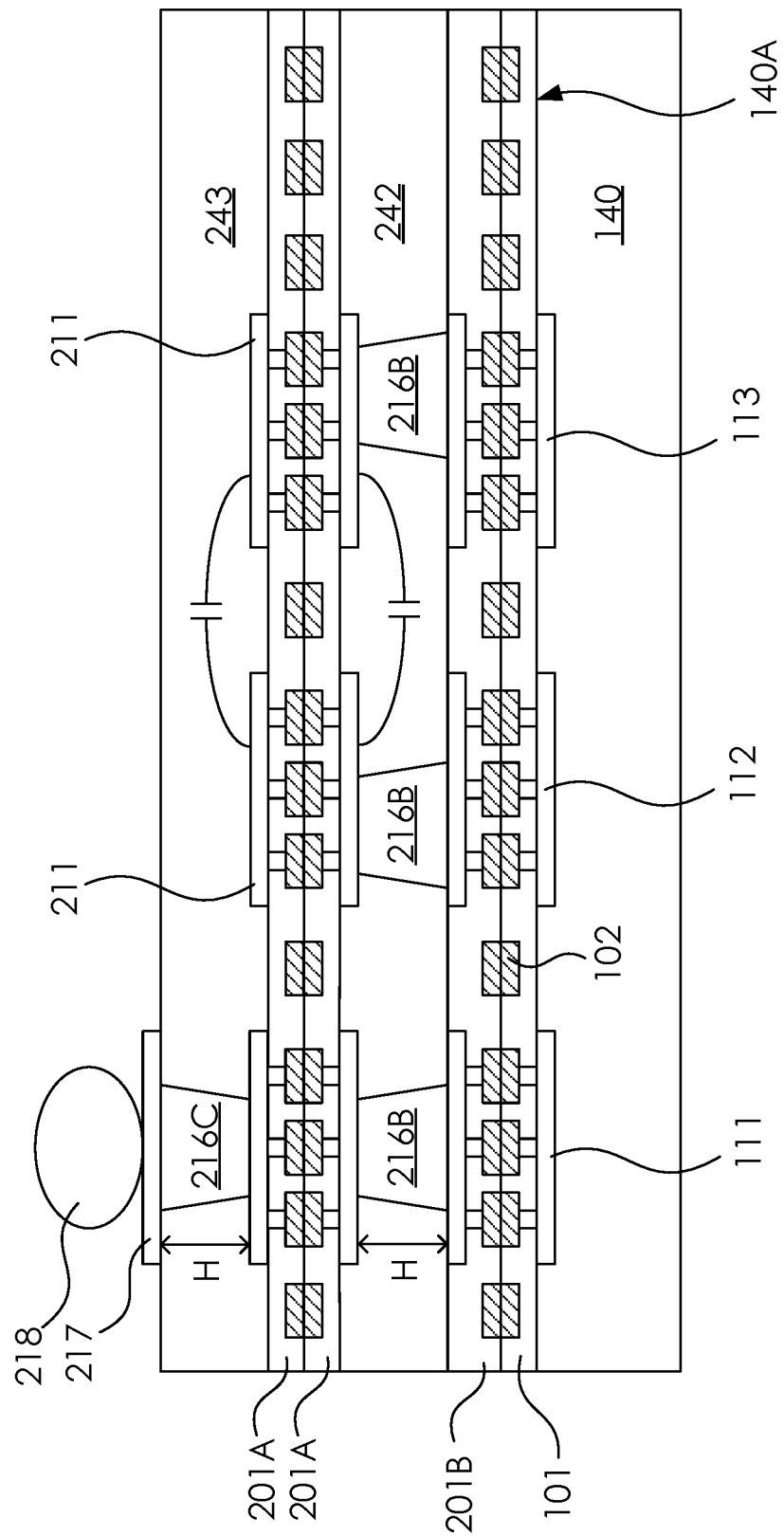
FIG. 15 illustrates a cross-sectional view of a semiconductor structure according to some embodiments of the present disclosure.
Figure 16:
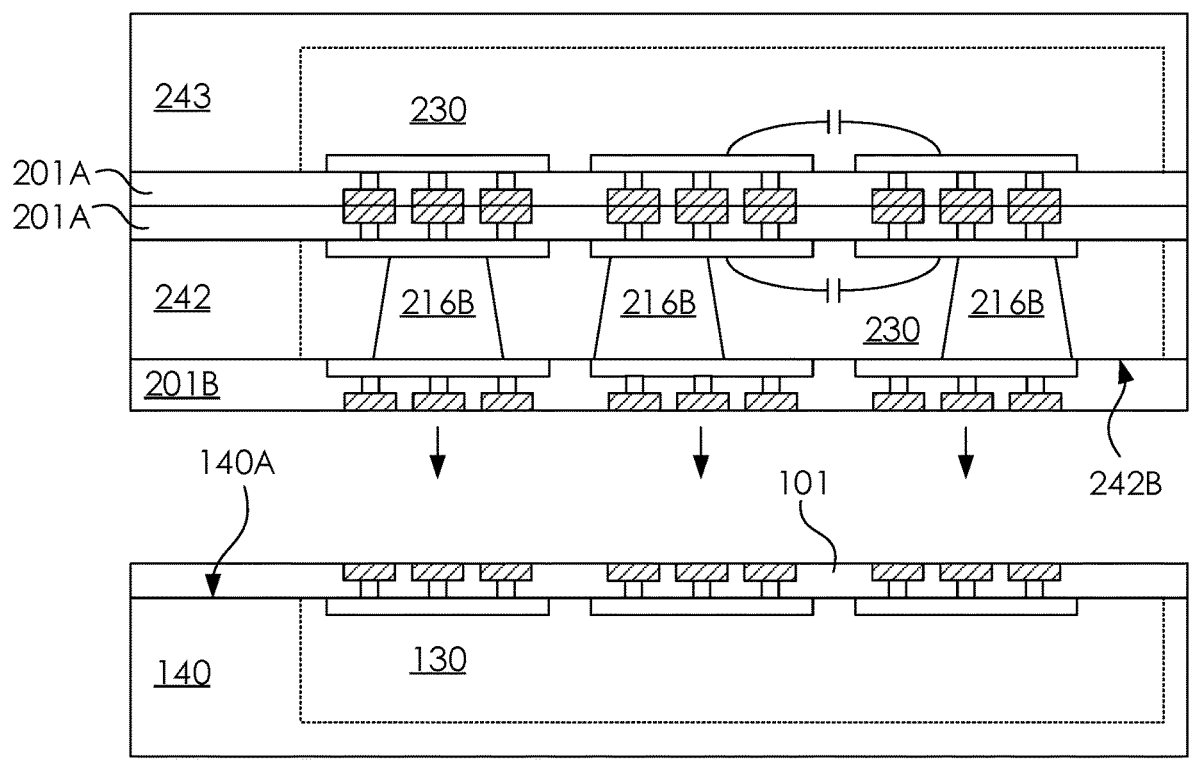
FIG. 16 illustrates a cross-sectional view of forming a semiconductor structure according to some embodiments of the present disclosure.

As shown in FIG. 15, in some embodiments, more than one capacitor wafers (i.e., the second wafers 242, 243) may be stacked over the active wafer (i.e., the first wafer 140) with a face-to-face arrangement between the capacitor wafers. In such embodiments, the second wafer 243 is stacked over the second wafer 242 with a face-to-face arrangement, while the second wafer 242 is stacked over the first wafer 140 with a face-to-back arrangement. As previously shown in FIGS. 14A to 14F, the second wafer 242 may be stacked over the second wafer 243 through the third hybrid bonding layers 201A formed on the front sides 242A, 243A of the second wafers 242, 243, and forms the second stacked wafer 62 thereby. The second stacked wafer 62 may be stacked over the first wafer 140 directly, without stacking the second wafer 241 over the first wafer 140. As shown in FIG. 16, in such embodiments, the fourth hybrid layer 201B on the back side 242B of the second wafer 242 may be hybrid bonded to the first hybrid layer 101 on the front side 140A of the first wafer 140. The operations regarding the details of thinning the second wafer 243, forming the BTSV 216C, and forming of the conductive pad 217 and the conductive bump 218 may refer to FIGS. 10D to 10E and are omitted here for brevity.

Briefly, according to the above mentioned embodiments, the capacitance of the semiconductor structure (e.g., IC) may be enhanced tremendously through hybrid bonding technique, for instance, the bonding pitch between each two adjacent bonding pads in the hybrid bonding layers is less than about 3 µm, and therefore millions of connections may be used to connect the active die and the capacitor die and therefore the ESR and ESL may be greatly reduced to provide an ideal performance of the IC. Moreover, the die stacked over the active die may not only include capacitors, but also DRAM structures and/or a switched capacitor regulator circuit that may broaden the functions of the IC or may provide a better fin-grain domain control, for example, output optimized voltages for integrated GPU/CPU.

In one exemplary aspect, a method for manufacturing a semiconductor structure is provided. The method includes the operations as follows. A first hybrid bonding layer is formed over a first wafer having a logic structure. A second hybrid bonding layer is formed over a second water having a first capacitor structure. The first water and the second wafer are bonded through a hybrid bonding operation to connect the first hybrid bonding layer and the second hybrid bonding layer, thereby a first bonded wafer is obtained, and the first capacitor structure is electrically connected to the logic structure through the first hybrid bonding layer and the second hybrid bonding layer. The first bonded wafer is singulated to obtain a plurality of semiconductor structures.

In yet another exemplary aspect, a method for manufacturing a semiconductor structure is provided. The method includes the operations. A first hybrid bonding layer is formed over a front side of a first wafer having a logic structure. A plurality of second wafers having a plurality of first capacitor structures are formed over the first hybrid bonding layer, thereby obtaining a stacked wafer, and the first plurality of first capacitor structures are electrically connected to the logic structure through the first hybrid bonding layer. The stacked wafer is singulated to obtain a plurality of semiconductor structures.

The foregoing outlines structures of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, the method comprising:
    forming a first hybrid bonding layer over a first wafer having a logic structure;
    forming a second hybrid bonding layer over a second wafer having a first capacitor structure;
    bonding the first wafer and the second wafer through a hybrid bonding operation to connect the first hybrid bonding layer and the second hybrid bonding layer, thereby obtaining a first bonded wafer, and the first capacitor structure is electrically connected to the logic structure through the first hybrid bonding layer and the second hybrid bonding layer;
    thinning the second wafer from a back side of the second wafer;
    forming a through via extending from the back side of the second wafer to a metal in an interlayer dielectric (ILD) of the first wafer; and
    singulating the first bonded wafer to obtain a plurality of semiconductor structures.

2. A method for manufacturing a semiconductor structure, the method comprising:
    forming a first hybrid bonding layer over a first wafer having a logic structure;
    forming a second hybrid bonding layer over a second wafer having a first capacitor structure;
    bonding the first wafer and the second wafer through a hybrid bonding operation to connect the first hybrid bonding layer and the second hybrid bonding layer, thereby obtaining a first bonded wafer, and the first capacitor structure is electrically connected to the logic structure through the first hybrid bonding layer and the second hybrid bonding layer;
    thinning the second wafer from a back side of the second wafer;

forming a through via extending from the back side to a metal layer in an interlayer dielectric (ILD) of the second wafer;
forming a fourth hybrid bonding layer over the back side of the second wafer;
forming a third hybrid bonding layer over a third wafer having a second capacitor structure;
bonding the third wafer to the first bonded wafer through a hybrid bonding operation to connect the third hybrid bonding layer and the fourth hybrid bonding layer, and thereby obtaining a second bonded wafer; and
singulating the second bonded wafer to obtain a plurality of semiconductor structures.

3. The method of claim 1, wherein forming the first hybrid bonding layer comprises forming a plurality of conductive pads having a pitch smaller than about 3 μm.

4. The method of claim 1, wherein thinning the second wafer from a back side of the second wafer comprises performing a thinning operation until a thickness from the back side of the second wafer to a metal layer in an interlayer dielectric (ILD) of the second wafer is less than about 10 μm.

5. The method of claim 2, further comprising:
forming a conductive pad and a conductive bump in contact with the conductive pad in a reserved region at a back side of the third wafer.

6. A method for manufacturing a semiconductor structure, the method comprising:
forming a first hybrid bonding layer over a first wafer having a logic structure;
forming a second hybrid bonding layer over a second wafer having a first capacitor structure;
bonding the first wafer and the second wafer through a hybrid bonding operation to connect the first hybrid bonding layer and the second hybrid bonding layer, thereby obtaining a first bonded wafer, and the first capacitor structure is electrically connected to the logic structure through the first hybrid bonding layer and the second hybrid bonding layer;
thinning the second wafer from a back side of the second wafer;
forming a through via extending from the back side to a metal layer in an interlayer dielectric (ILD) of the second wafer;
forming a fourth hybrid bonding layer over the back side of the second wafer;
forming a third hybrid bonding layer over a front side of the third wafer;
forming another third hybrid bonding layer over a front side of a fourth wafer;
bonding the third wafer and the fourth wafer through a hybrid bonding operation to connect the third hybrid bonding layers, and thereby obtaining a second bonded wafer;
bonding the first bonded wafer and the second bonded wafer through a hybrid bonding operation, and thereby obtaining a third bonded wafer; and
singulating the third bonded wafer to obtain a plurality of semiconductor structures.

7. A method for manufacturing a semiconductor structure, the method comprising:
forming a first hybrid bonding layer over a first wafer having a logic structure;
forming a second hybrid bonding layer over a second wafer having a first capacitor structure;
bonding the first wafer and the second wafer through a hybrid bonding operation to connect the first hybrid bonding layer and the second hybrid bonding layer, thereby obtaining a first bonded wafer, and the first capacitor structure is electrically connected to the logic structure through the first hybrid bonding layer and the second hybrid bonding layer; and
bonding a third wafer over the second wafer through a hybrid bonding operation prior to bonding the second wafer over the first wafer; and
singulating the first bonded wafer to obtain a plurality of semiconductor structures.

8. The method of claim 7, wherein a third hybrid bonding layer on a front side of the third wafer is hybrid bonded to the second hybrid bonding layer on a front side of the second wafer.

9. A method for manufacturing a semiconductor structure, the method comprising:
forming a first hybrid bonding layer over a front side of a first wafer having a logic structure;
forming a plurality of second wafers over the first hybrid bonding layer, wherein each of the second wafers has a plurality of first capacitor structures, thereby obtaining a stacked wafer, and the plurality of first capacitor structures are electrically connected to the logic structure through the first hybrid bonding layer; and
singulating the stacked wafer to obtain a plurality of semiconductor structures.

10. The method of claim 9, wherein forming the plurality of second wafers having the plurality of first capacitor structures over the first hybrid bonding layer comprises:
forming a second hybrid bonding layer over a front side of a second wafer in the plurality of second wafers;
bonding the first wafer and the second wafer through a hybrid bonding operation to connect the first hybrid bonding layer and the second hybrid bonding layer.

11. The method of claim 10, wherein forming the plurality of second wafers having the plurality of first capacitor structures over the first hybrid bonding layer further comprises:
forming a fourth hybrid bonding layer over a back side of the second wafer;
forming a third hybrid bonding layer over a front side of a third wafer in the plurality of second wafers; and
bonding the second wafer and the third wafer through a hybrid bonding operation to connect the third hybrid bonding layer and the fourth hybrid bonding layer.

12. The method of claim 11, wherein forming the plurality of second wafers having the plurality of first capacitor structures over the first hybrid bonding layer further comprises:
forming a sixth hybrid bonding layer over a back side of the third wafer;
forming a sixth hybrid bonding layer over a front side of a fourth wafer in the plurality of second wafers; and
bonding the third wafer and the fourth wafer through a hybrid bonding operation to connect the fifth hybrid bonding layer and the sixth hybrid bonding layer.

13. The method of claim 12, wherein forming the plurality of second wafers having the plurality of first capacitor structures over the first hybrid bonding layer further comprises:
forming a conductive pad on a back side of the fourth wafer; and
forming a conductive bump in contact with the conductive pad.

14. The method of claim 10, wherein forming the plurality of second wafers having the plurality of first capacitor structures over the first hybrid bonding layer further comprises:

forming a third hybrid bonding layer over a back side of the second wafer;
forming a fourth hybrid bonding layer over a front side of a third wafer in the plurality of second wafers;
forming a fifth hybrid bonding layer over a front side of a fourth wafer in the plurality of second wafers; and
bonding the third wafer and the fourth wafer through a hybrid bonding operation to connect the fourth hybrid bonding layer and the fifth hybrid bonding layer to form a bonded wafer.

15. The method of claim 14, wherein forming the plurality of second wafers having the plurality of first capacitor structures over the first hybrid bonding layer further comprises:
forming a sixth hybrid bonding layer over a back side of the third wafer; and
bonding the third wafer and the second wafer through a hybrid bonding operation to connect the sixth hybrid bonding layer and the third hybrid bonding layer.

16. The method of claim 15, wherein forming the plurality of second wafers having the plurality of first capacitor structures over the first hybrid bonding layer further comprises:
forming a conductive pad on a back side of the fourth wafer; and
forming a conductive bump in contact with the conductive pad.

17. A method for manufacturing a semiconductor structure, the method comprising:
forming a first hybrid bonding layer over a front side of a first wafer having a logic structure;
forming a plurality of second wafers having a plurality of first capacitor structures over the first hybrid bonding layer, thereby obtaining a stacked wafer, and the plurality of first capacitor structures are electrically connected to the logic structure through the first hybrid bonding layer; and
singulating the stacked wafer to obtain a plurality of semiconductor structures;
wherein forming the plurality of second wafers having the plurality of first capacitor structures over the first hybrid bonding layer comprises:
forming a second hybrid bonding layer over a front side of a second wafer in the plurality of second wafers;
forming a third hybrid bonding layer over a front side of a third wafer in the plurality of second wafers; and
bonding the second wafer and the third wafer through a hybrid bonding operation to connect the second hybrid bonding layer and the third hybrid bonding layer to form a bonded wafer.

18. The method of claim 17, wherein forming the plurality of second wafers having the plurality of first capacitor structures over the first hybrid bonding layer further comprises:
forming a fourth hybrid bonding layer over a back side of the second wafer; and
bonding the second wafer and the first wafer through a hybrid bonding operation to connect the fourth hybrid bonding layer and the first hybrid bonding layer.

19. The method of claim 18, wherein forming the plurality of second wafers having the plurality of first capacitor structures over the first hybrid bonding layer further comprises:
forming a conductive pad on a back side of the third wafer; and
forming a conductive bump in contact with the conductive pad.

20. A method for manufacturing a semiconductor structure, the method comprising:
forming a first hybrid bonding layer over a first wafer having a logic structure;
forming a second hybrid bonding layer over a second wafer having a metal-insulator-metal (MIM) capacitor structure;
bonding the first wafer and the second wafer through a hybrid bonding operation to connect the first hybrid bonding layer and the second hybrid bonding layer, thereby obtaining a first bonded wafer, and the first capacitor structure is electrically connected to the logic structure through the first hybrid bonding layer and the second hybrid bonding layer; and
singulating the first bonded wafer to obtain a plurality of semiconductor structures.

21. The method of claim 20, wherein forming the second hybrid bonding layer over the second wafer having the MIM capacitor structure further comprises:
forming the MIM capacitor in a semiconductor substrate of the second wafer.

22. The method of claim 21, wherein the MIM capacitor structure is a deep trench MIM capacitor.

23. The method of claim 20, wherein forming the second hybrid bonding layer over the second wafer having the MIM capacitor structure further comprises:
forming the MIM capacitor in an interlayer dielectric (ILD) of the second wafer by using DRAM process technology.

24. The method of claim 23, wherein the MIM capacitor structure is a MIM stack capacitor.

25. The method of claim 20, wherein a density of the MIM capacitor structure in the second wafer is about 1 $\mu F/mm^2$.

* * * * *